(12) United States Patent
Choi

(10) Patent No.: US 12,433,110 B2
(45) Date of Patent: Sep. 30, 2025

(54) DISPLAY DEVICE WITH RECESS IN INSULATING FILMS

(71) Applicant: Samsung Display Co., LTD., Yongin-si (KR)

(72) Inventor: Jong Hyun Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 620 days.

(21) Appl. No.: 17/676,974

(22) Filed: Feb. 22, 2022

(65) Prior Publication Data

US 2023/0006013 A1  Jan. 5, 2023

(30) Foreign Application Priority Data

Jun. 30, 2021 (KR) .................. 10-2021-0085397

(51) Int. Cl.
H10K 59/124 (2023.01)
H10K 59/121 (2023.01)
H10K 59/131 (2023.01)

(52) U.S. Cl.
CPC ....... *H10K 59/124* (2023.02); *H10K 59/1213* (2023.02); *H10K 59/131* (2023.02)

(58) Field of Classification Search
CPC .. H10K 59/124; H10K 59/131; H10K 59/123; H01L 27/1248; H01L 27/124; H01L 27/1222; G09G 3/3233; G09G 2300/0426
See application file for complete search history.

(56) References Cited

U.S. PATENT DOCUMENTS

| 11,024,687 B2 * | 6/2021 | Zhang .................. H10K 59/126 |
| 11,177,335 B2 | 11/2021 | Park et al. |
| 11,222,938 B2 | 1/2022 | Kim et al. |
| 11,917,869 B2 | 2/2024 | Kim et al. |
| 2016/0233289 A1 * | 8/2016 | Son ........................ H10K 59/80 |

(Continued)

FOREIGN PATENT DOCUMENTS

| KR | 1020180112193 A | 10/2018 |
| KR | 1020190055868 A | 5/2019 |

(Continued)

*Primary Examiner* — Chad M Dicke
*Assistant Examiner* — Jeremy Daniel Watts
(74) *Attorney, Agent, or Firm* — CANTOR COLBURN LLP

(57) ABSTRACT

A display device includes a first pixel, a second pixel disposed adjacent to the first pixel, and a recess pattern traversing between the first pixel and the second pixel when viewed from top. Each of the first pixel and the second pixel includes a first supply voltage line, a light-emitting element, a first transistor connected between the first supply voltage line and the light-emitting element, a second transistor connected between the first transistor and the light-emitting element, and a third transistor connected to the light-emitting element. The display device further includes a first semiconductor layer defining a channel of each of the first transistor, the second transistor, and the third transistor. The second transistor of the first pixel is connected to the third transistor of the second pixel via the first semiconductor layer. The first semiconductor layer overlaps the recess pattern between the first pixel and the second pixel.

20 Claims, 23 Drawing Sheets

(56) References Cited

U.S. PATENT DOCUMENTS

| | | | |
|---|---|---|---|
| 2016/0268354 A1* | 9/2016 | Xiong | .................... H10K 50/16 |
| 2018/0322826 A1 | 11/2018 | Lee et al. | |
| 2019/0148476 A1* | 5/2019 | Park | .................. H10K 59/8731 |
| | | | 257/40 |
| 2019/0278145 A1 | 9/2019 | Tanaka et al. | |
| 2020/0303479 A1* | 9/2020 | Kim | ................... H10K 59/1213 |
| 2021/0020872 A1* | 1/2021 | Park | ...................... H10D 86/451 |
| 2021/0407343 A1* | 12/2021 | Wu | ........................ G09F 9/301 |
| 2022/0077274 A1 | 3/2022 | Park et al. | |

FOREIGN PATENT DOCUMENTS

| | | |
|---|---|---|
| KR | 1020200085962 A | 7/2020 |
| KR | 1020200113055 A | 10/2020 |

\* cited by examiner

100: 110, 120, 130, 140, 150, 160, CA1, CA2
200: 210, 220, 230
300: 310, 320, 330
500: 510, 520
600: 610, 620, 630, 640, 650, 660, 670, 680, 690, VINTL, AINTL
700: 710, 720, 730

DISPLAY DEVICE WITH RECESS IN INSULATING FILMS

This application claims priority to Korean Patent Application No. 10-2021-0085397, filed on Jun. 30, 2021, and all the benefits accruing therefrom under 35 U.S.C. § 119, the content of which in its entirety is herein incorporated by reference.

BACKGROUND

1. Field

The disclosure relates to a display device.

2. Description of the Related Art

As the information-oriented society evolves, display devices are widely used in various fields. For example, display devices are being employed by a variety of electronic devices such as smart phones, digital cameras, laptop computers, navigation devices, and smart televisions.

As such display devices, various types of display devices such as liquid-crystal display ("LCD") devices and organic light-emitting display ("OLED") devices are currently used. Among the various types of display devices, an organic light-emitting display device displays images by using an organic light-emitting element that emits light as electrons and holes recombine. Such an organic light-emitting display device typically includes a plurality of transistors for providing a driving current to the organic light-emitting element.

SUMMARY

As display devices are employed by a variety of electronic devices, a display device having a structure that is robust against external impact is desired.

Embodiments of the disclosure provide a display device having a space for designing a pixel circuit while having a structure robust against external impact.

According to an embodiment of the disclosure, a display device includes a first pixel, a second pixel disposed adjacent to the first pixel, and a recess pattern traversing between the first pixel and the second pixel when viewed from a top plan view. In such an embodiment, each of the first pixel and the second pixel includes a first supply voltage line, a light-emitting element, a first transistor connected between the first supply voltage line and the light-emitting element, a second transistor connected between the first transistor and the light-emitting element, and a third transistor electrically connected to a first electrode of the light-emitting element. In such an embodiment, the display device further includes a first semiconductor layer including a channel of each of the first transistor, the second transistor, and the third transistor. In such an embodiment, the second transistor of the first pixel is electrically connected to the third transistor of the second pixel via the first semiconductor layer. In such an embodiment, the first semiconductor layer overlaps the recess pattern between the first pixel and the second pixel.

In an embodiment, the first semiconductor layer may include a first semiconductor connection pattern and a second semiconductor connection pattern connecting the second transistor of the first pixel with the third transistor of the second pixel. In such an embodiment, the first semiconductor connection pattern and the second semiconductor connection pattern may overlap the recess pattern.

In an embodiment, the first semiconductor connection pattern may be extended in a first direction. In such an embodiment, the second semiconductor connection pattern may be extended in a second direction intersecting the first direction.

In an embodiment, the first semiconductor connection pattern may intersect the recess pattern extended in the second direction. In such an embodiment, the second semiconductor connection pattern may intersect the recess pattern extended in the first direction.

In an embodiment, at least one through hole may be defined through the first semiconductor layer at a location where the first semiconductor layer overlaps the recess pattern.

In an embodiment, the display device may further include an etch stop pattern disposed on the first semiconductor layer at a location where the first semiconductor layer and the recess pattern overlap each other.

In an embodiment, the recess pattern may expose the etch stop pattern.

In an embodiment, the etch stop pattern may have an island shape when viewed from the top plan view.

In an embodiment, the display device may further include a first conductive layer including gate electrodes of the first transistor, the second transistor and the third transistor of each of the first pixel and the second pixel. In an embodiment, the etch stop pattern may be defined by the first conductive layer.

In an embodiment, Each of the first pixel and the second pixel may further include a fourth transistor connected between the first electrode and the gate electrode of the first transistor. In an embodiment, the display device may further include a second semiconductor layer which defines a channel of the fourth transistor and is different from the first semiconductor layer.

In an embodiment, The display device may further include a data line. In an embodiment, each of the first pixel and the second pixel may further include a fifth transistor connected to a second electrode of the first transistor and the data line. In an embodiment, a channel of the fifth transistor may be defined by the second semiconductor layer.

In an embodiment, the display device may further include an emission control line. In an embodiment, a gate electrode of the second transistor of each of the first pixel and the second pixel may be electrically connected to the emission control line.

In an embodiment, the display device may further include an initialization voltage line. In an embodiment, a first electrode of the third transistor may be electrically connected to the initialization voltage line. In an embodiment, a second electrode of the third transistor may be electrically connected to the light-emitting element.

According to an embodiment of the disclosure, a display device includes a substrate, pixels disposed on the substrate, where the pixels includes a first pixel and a second pixel, and a recess pattern at least partially disposed between the first pixel and the second pixel. In an embodiment, each of the first pixel and the second pixel includes a first semiconductor layer, and insulating films disposed on the first semiconductor layer. In an embodiment, the recess pattern is defined by at least some of the insulating films, and has a shape depressed from upper surfaces to lower surfaces of the insulating films. In an embodiment, the first semiconductor layer and the recess pattern intersect each other.

In an embodiment, the first semiconductor layer may define channels of the first transistor and the second transistor of each of the first pixel and the second pixel, and a semiconductor connection pattern connecting the channel of the first transistor of the first pixel with the channel of the second transistor of the second pixel. In an embodiment, the semiconductor connection pattern intersects the recess pattern.

In an embodiment, the display device may further include an emission control line. In an embodiment, a gate electrode of the first transistor of each of the first pixel and the second pixel may be electrically connected to the emission control line.

In an embodiment, the display device may further include an initialization voltage line. In an embodiment, a first electrode of the second transistor of each of the first pixel and the second pixel may be electrically connected to the initialization voltage line.

In an embodiment, each of the first pixel and the second pixel may further include a light-emitting element. In an embodiment, the light-emitting element may be electrically connected to a second electrode of the second transistor.

In an embodiment, the display device may further include an etch stop pattern disposed on the first semiconductor layer at a location where the first semiconductor layer and the recess pattern overlap each other.

According to embodiments of the disclosure, a display device includes a first pixel including a first transistor, a second pixel including a second transistor, a recess pattern disposed between the first pixel and the second pixel and extended in a first direction, a conductive pattern extended in a second direction crossing the first direction, where the conductive pattern defines a gate electrode of the first transistor and a gate electrode of the second transistor, and an insulating films disposed on the conductive pattern. In an embodiment, the recess pattern is defined by at least some of the insulating films, and has a shape depressed from upper surfaces to lower surfaces of the insulating films. In an embodiment, the conductive pattern and the recess pattern intersect each other.

According to embodiments of the disclosure, a display device may have a sufficient space for designing a pixel circuit while having a structure robust against external impact.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
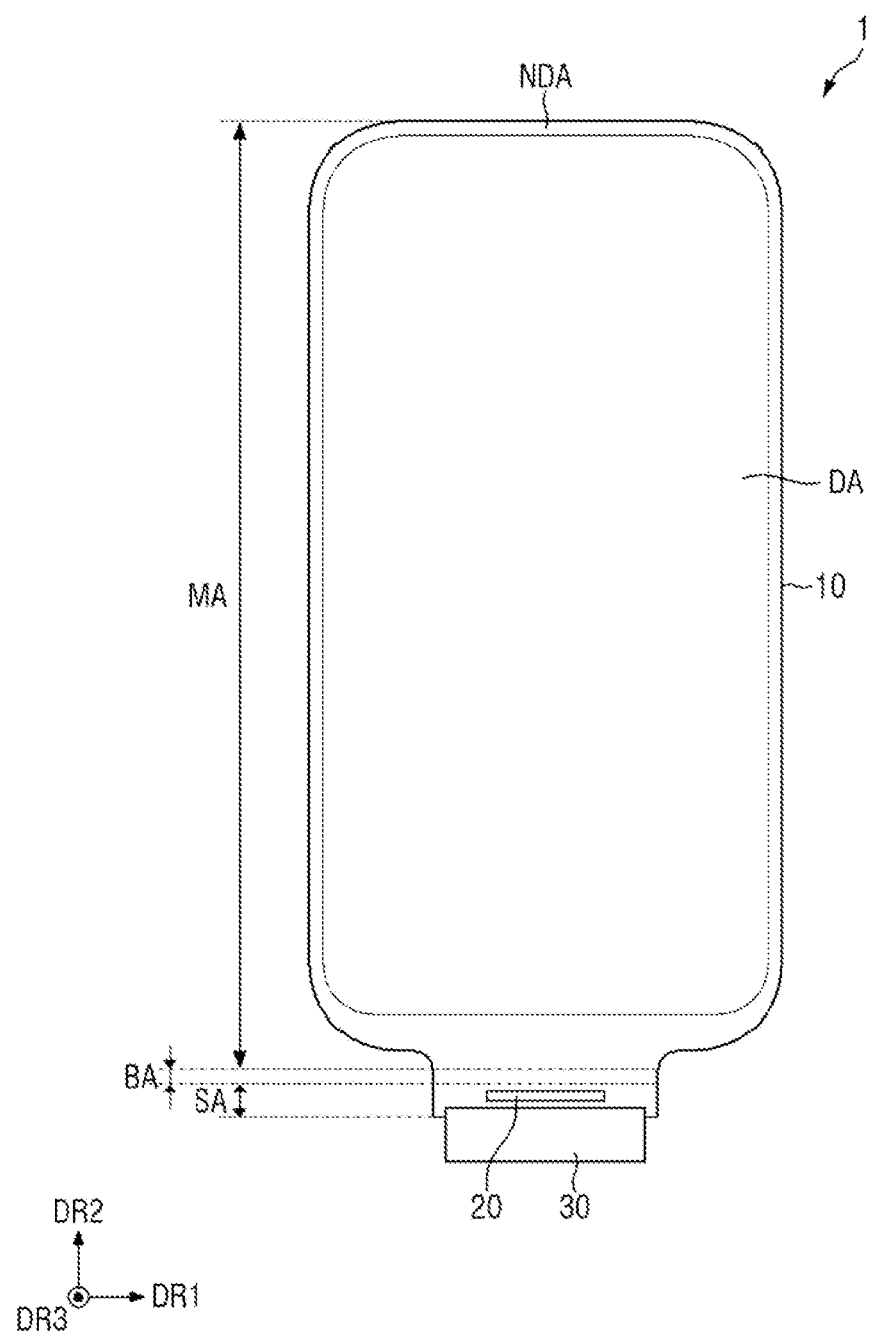
FIG. 1 is a plan view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from X, Y, and Z" may be construed as X only, Y only, Z only, or any combination of two or more of X, Y, and Z, such as, for instance, XYZ, XYY, YZ, and ZZ. "Or" means "and/or." As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, embodiments of the disclosure will be described in detail with reference to the accompanying drawings.

Figure 2:
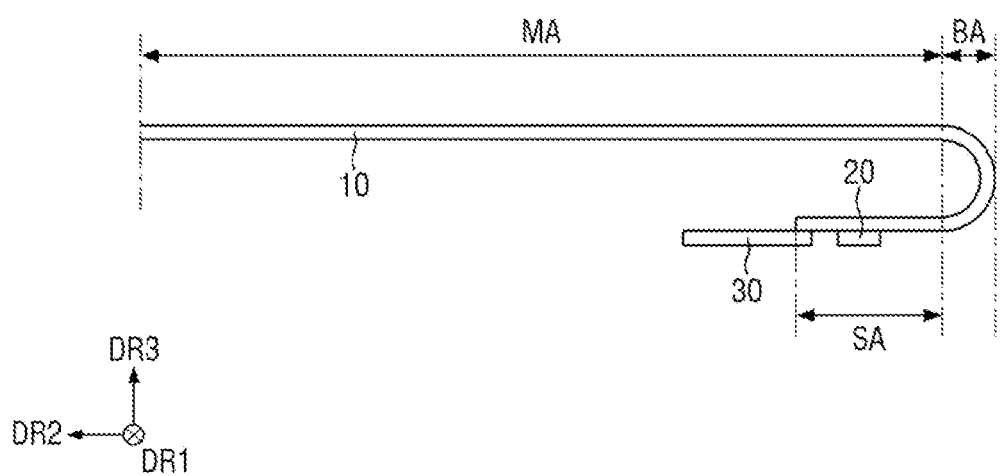
FIG. 2 is a side view of the display device of FIG. 1 in a bent state.

FIG. 1 is a plan view of a display device according to an embodiment of the disclosure. FIG. 2 is a side view of the display device of FIG. 1. FIG. 2 shows a side shape of a display device when a portion thereof is bent in thickness direction.

Referring to FIGS. 1 and 2, an embodiment of the display device 1 is a device for displaying moving images or still images. In an embodiment, the display device 1 may be used as the display screen of portable electronic devices such as a mobile phone, a smart phone, a tablet personal computer ("PC"), a smart watch, a watch phone, a mobile communications terminal, an electronic notebook, an electronic book, a portable multimedia player ("PMP"), a navigation device and a ultra mobile PC ("UMPC"), as well as the display screen of various products such as a television, a notebook/laptop computer, a monitor, a billboard and the Internet of Things ("IoT").

According to an embodiment of the disclosure, the display device 1 may have a substantially rectangular shape when viewed from the top or in a top plan view. The display device 1 may have a rectangular shape with corners at the right angle when viewed from the top. It is, however, to be understood that the disclosure is not limited thereto. The display device 1 may have a rectangular shape with rounded corners when viewed from the top.

In the drawings, the first direction DR1 denotes the horizontal direction of a display device 1 and the second direction DR2 denotes the vertical direction of the display device 1 when viewed from the top. In addition, the third direction DR3 may refer to the thickness direction of the display device 1. The first direction DR1 is perpendicular to the second direction DR2. The third direction the third direction DR3 is orthogonal to the plane defined by the first direction DR1 and the second direction DR2 and is perpendicular to the first and second directions DR1 as well as the second direction DR2. It should be understood that the directions referred to in the embodiments are relative directions, and the embodiments are not limited to the directions mentioned.

As used herein, the terms "top", "upper surface" and "upper side" in the third direction DR3 refer to the display side of a display panel 10, whereas the terms "bottom", "lower surface" and "lower" refer to the opposite side of the display panel 10, unless stated otherwise.

In an embodiment, the display device 1 may be a rectangle having corners at the right angle or rounded corners when viewed from the top. The display device 1 may include short sides and long sides. The short sides of the display device 1 may be extended in the first direction DR1. The long sides of the display device 1 may be extended in the second direction DR2. It is, however, to be understood that the disclosure is not limited thereto. The shape of the display device 1 is not limited to a rectangle, and the display device 1 may have another shape such as a circle and an ellipse.

The display device 1 may include a display panel 10. The display panel 10 may include a flexible substrate including a flexible polymer material such as polyimide. Accordingly, the display panel 10 may be curved, bent, folded, or rolled.

The display panel 10 may be an organic light-emitting display panel. In the following description, embodiments where the display panel 10 is the organic light-emitting display panel will be described in detail. It is, however, to be understood that other types of display panels such as a liquid-crystal display ("LCD") panel, a quantum-dot organic light-emitting display ("QD-OLED") panel, a quantum-dot liquid-crystal display ("QD-LCD") panel, a quantum-nano light-emitting display ("Nano LED") panel and a micro LED panel.

In an embodiment, the display panel 10 may include a display area DA where images are displayed, and a non-display area NDA where no image is displayed. The display panel 10 may include the display area DA and the non-display area NDA when viewed from the top. The non-display area NDA may surround the display area DA. The non-display area NDA may form or define a bezel.

The display area DA may have a rectangular shape having corners at the right angle or rounded corners when viewed from the top. The display area DA may include short sides and long sides. The short sides of the display area DA may be extended in a first direction DR1. The long sides of the display area DA may be extended in a second direction DR2. It is, however, to be understood that the disclosure is not limited thereto. The shape of the display area DA is not limited to a rectangle, and the display area DA may have another shape such as a circle and an ellipse.

The display area DA may include a plurality of pixels. The pixels may be arranged in a matrix. Each of the pixels may include an emissive layer and a circuit layer for controlling the amount of light emitted from the emissive layer. The circuit layer may include lines, electrodes and at least one transistor. The emissive layer may include an organic light-emitting material. The emissive layer may be encapsulated by an encapsulation layer. The configuration of the pixels will be described in detail later.

In an embodiment, the non-display area NDA may be disposed adjacent to the two short sides and the two long sides of the display area DA. In such an embodiment, the display area NA may surround all of the sides of the display area DA and may form or define the edges of the display area DA. It is, however, to be understood that the disclosure is not limited thereto. Alternatively, the non-display area NDA may be disposed adjacent only to the two short sides or only to the two long sides of the display area DA.

The display panel 10 may include a main area MA and a bending area BA connected to one side of the main area MA in the second direction DR2. The display panel 10 may further include a subsidiary area SA connected to one side of the bending area BA in the second direction DR2 and overlapping the main area MA when a portion thereof is bent in the thickness direction.

The display area DA may be located in the main area MA. The non-display area NDA may be located at the peripheral edge of the display area DA in the main area MA.

The main area MA may have a shape similar to the outer shape of the display device 1 when viewed from the top. The main area MA may be a flat area located in one plane. It is, however, to be understood that the disclosure is not limited thereto. Alternatively, at least one of the edges of the main area MA except for the edge (side) connected to the bending area BA may be bent to form a curved surface or may be bent at a right angle.

When at least one of the edges of the main area MA except for the edge (side) connected to the bending area BA is curved or bent, the display area DA may also be disposed at the edge. It is, however, to be understood that the disclosure is not limited thereto. Alternatively, the non-display area NDA that does not display image may be disposed on the curved or bent edge, or the display area DA and the non-display area NDA may be disposed together on the curved or bent edge.

The non-display area NDA of the main area MA may be extended from the outer border of the display area DA to the edge of the display panel 10. In the non-display area NDA of the main area MA, signal lines for applying signals to the display area DA or driving circuits may be disposed.

The bending area BA may be connected through one short side of the main area MA. The width of the bending area BA (the width in the first direction DR1) may be smaller than the width of the main area MA (the width of the short side). The portions where the main area MR meets the bending area BR may be cut in an L-shape to reduce the bezel width.

In the bending area BA, the display panel 10 may be bent with a curvature toward the opposite side of the display surface. As the display panel 10 is bent at the bending area BA, the surface of the display panel 10 may be reversed. In such an embodiment, the surface of the display panel 10 facing upward may be bent such that the surface faces outward at the bending area BA and then faces downward.

The subsidiary area SA is extended from the bending area BA. The subsidiary area SA may be extended in a direction parallel to the main area MA from the end of the bending region. The subsidiary area SA may overlap the main area MA in the thickness direction of the display panel 10. The subsidiary area SA may overlap the non-display area NDA at the edge of the main area MA and may also overlap the display area DA of the main area MA. The width of the subsidiary area SA may be, but is not limited to being, equal to the width of the bending area BA.

A pad area may be located on the subsidiary area SA of the display panel 10. An external device may be mounted on (or attached to) the pad area. In an embodiment, the external device include a driving chip 20, a driving board 30 implemented as a flexible printed circuit board or a rigid printed circuit board, for example. Other line connection films, connectors, etc., may be mounted on the pad area as well. More than one external devices may be mounted on the subsidiary area SA. In an embodiment, for example, as shown in FIGS. 1 and 2, the driving chip 20 may be disposed in the subsidiary area SA of the display panel 10, and the driving board 30 may be attached to an end of the subsidiary area SA. In such an embodiment, the display panel 10 may include a pad area connected to the driving chip 20, as well as a pad area connected to the driving board 30. According to an alternative embodiment, a driving chip may be mounted on a film, and the film may be attached to the subsidiary area SA of the display panel 10.

The driving chip 20 is mounted on the surface of the display panel 10 which is the display surface. As the bending area BA is bent and accordingly the surface is reversed as described above, the driving chip 20 may be mounted on the surface of the display panel 10 facing downward in the thickness direction, such that the upper surface of the driving chip 20 may face downward.

The driving chip 20 may be attached on the display panel 10 by an anisotropic conductive film or on the display panel 10 by ultrasonic bonding. The width of the driving chip 20 may be less than the width of the display panel 10 in the horizontal direction. The driving chip 20 may be disposed at the center of the subsidiary area SA in the horizontal direction (the first direction DR1), and the left and right edges of the driving chip 20 may be spaced apart from the left and right edges of the subsidiary area SA, respectively.

The driving chip 20 may include an integrated circuit for driving the display panel 10. In an embodiment, the integrated circuit may be, but is not limited to, a data driving integrated circuit that generates and provides data signals. The driving chip 20 is connected to line pads (not shown) disposed in the pad area of the display panel 10 to provide data signals toward the line pads. Lines connected to the line pads (not shown) may be extended toward the pixels to apply a data signal and the like to the pixels.

Figure 3:
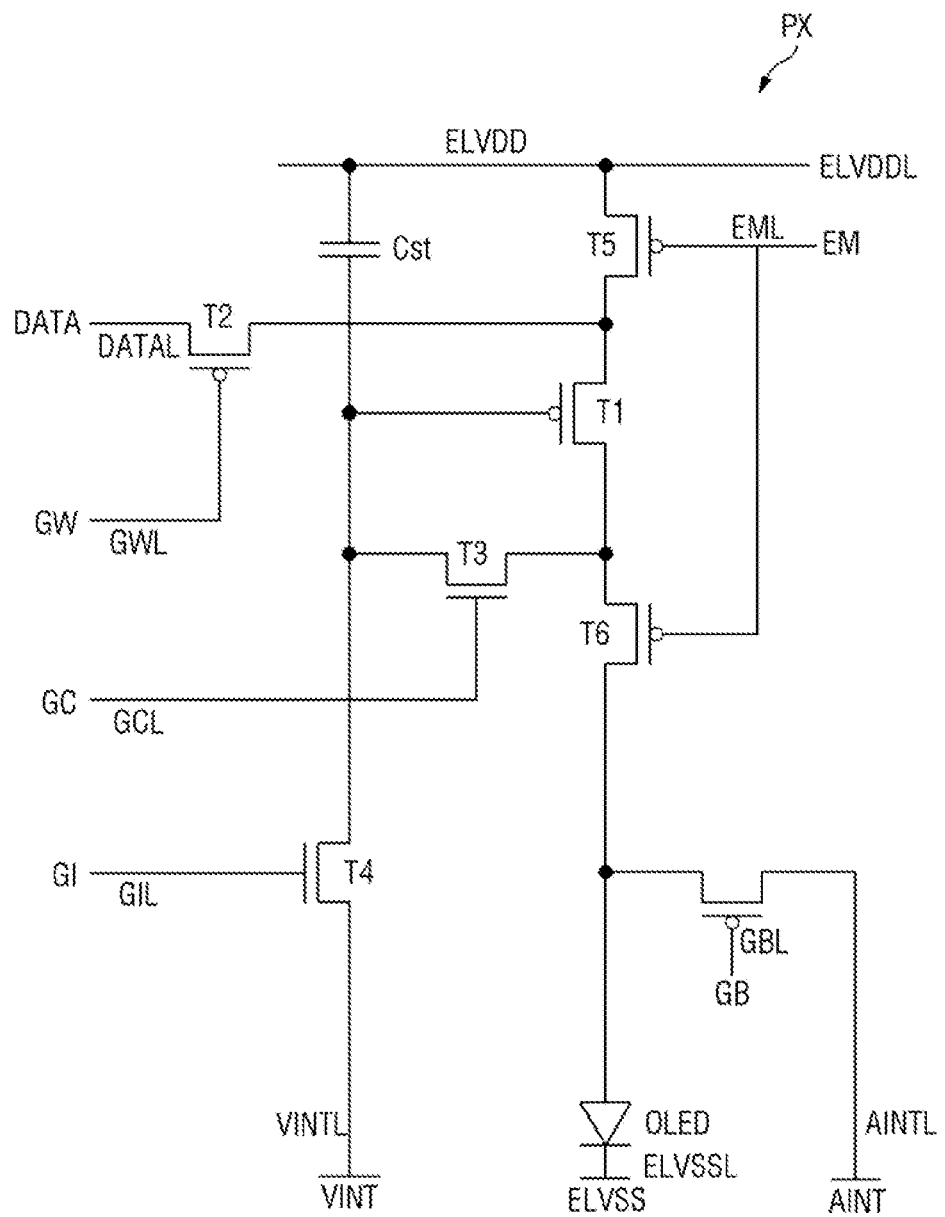
FIG. 3 is an equivalent circuit diagram of a pixel of a display device according to an embodiment of the disclosure.

FIG. 3 is an equivalent circuit diagram of a pixel of a display device according to an embodiment of the disclosure.

Referring to FIG. 3, the circuit of a pixel PX of the display device may include an organic light-emitting diode OLED, a plurality of transistors T1 to T7, and a storage capacitor Cst. In an embodiment, a data signal DATA, a first scan signal GW, a second scan signal GC, a third scan signal GI, a fourth scan signal GB, an emission control signal EM, a first supply voltage ELVDD, a second supply voltage ELVSS, a first initialization voltage VINT and a second initialization voltage AINT are applied to the circuit of the pixel PX.

The fourth scan signal GB may be substantially the same as the first scan signal GW of an adjacent pixel. In such an embodiment, although four scan lines are shown in FIG. 3, a fourth scan line GBL for transmitting the fourth scan signal GB among the four scan lines may be interconnected with a first scan line GWL for transmitting the first scan signal GW in an adjacent pixel and may transmit substantially the same scan signal. In such an embodiment, the first scan line GWL and the fourth scan line GBL may be substantially the same scan line, and each of the pixels PX may include actually three scan signals and three scan lines.

The organic light-emitting diode OLED includes an anode electrode (or a first electrode) and a cathode electrode (or a second electrode). The storage capacitor Cst includes a first electrode and a second electrode.

The plurality of transistors may include first to seventh transistors T1 to T7. Each of the transistors T1 to T7 includes a gate electrode, a first electrode (or a first source/drain electrode), and a second electrode (or a second source/drain electrode). One of the first electrode and the second electrode of each of the transistors T1 to T7 is a source electrode and the other of the first electrode and the second electrode of each of the transistors T1 to T7 is a drain electrode.

Each of the transistors T1 to T7 may be a thin-film transistor. Each of the transistors T1 to T7 may be either a P-channel metal-oxide-semiconductor ("PMOS") transistor or an N-channel metal-oxide-semiconductor ("NMOS") transistor. In an embodiment, the first transistor T1 as a driving transistor, the second transistor T2 as a data transfer transistor, the fifth transistor T5 as a first emission control transistor, the sixth transistor T6 as a second emission control transistor and the seventh transistor T7 as a second initializing transistor are PMOS transistors. In such an embodiment, the third transistor T3 as a compensating transistor, and the fourth transistor T4 as a first initializing transistor may be NMOS transistors. The PMOS transistors and the NMOS transistors have different characteristics from each other. The third transistor T3 and the fourth transistor T4 are implemented with NMOS transistors having a relatively good turn-off characteristic so that leakage of the driving current during the emission period of the organic light-emitting diode OLED may be reduced.

Hereinafter, each of the elements of the pixel PX will be described in detail.

The gate electrode of the first transistor T1 is connected to the first electrode of the storage capacitor Cst. The first electrode of the first transistor T1 is connected to a first supply voltage line ELVDD for applying the first supply voltage ELVDD via the fifth transistor T5. The second electrode of the first transistor T1 is connected to the anode electrode of the organic light-emitting diode OLED via the sixth transistor T6. The first transistor T1 receives the data signal DATA in response to the switching operation of the second transistor T2 to supply the driving current to the organic light-emitting diode OLED.

The gate electrode of the second transistor T2 is connected to the first scan line GWL for applying the first scan signal GW. The first electrode of the second transistor T2 is connected to the data line DATAL for applying the data signal DATA. The second electrode of the second transistor T2 is connected to the first electrode of the first transistor T1 and is connected to the first supply voltage line ELVDD via the fifth transistor T5. The second transistor T2 is turned on in response to the first scan signal GW to transfer the data signal DATA to the first electrode of the first transistor T1.

The gate electrode of the third transistor T3 is connected to the second scan line GCL for applying the second scan signal GC. The first electrode of the third transistor T3 is connected to the second electrode of the first transistor T1 and is connected to the anode electrode of the organic light-emitting diode OLED via the sixth transistor T6. The second electrode of the third transistor T3 is connected to the first electrode of the storage capacitor Cst, the first electrode of the fourth transistor T4 and the gate electrode of the first transistor T1. The third transistor T3 is turned on in response to the second scan signal GC to connect the gate electrode with the second electrode of the first transistor T1, so that the first transistor T1 is in diode connection. Accordingly, even though a voltage difference equal to the threshold voltage of the first transistor T1 is generated between the first electrode and the gate electrode of the first transistor T1, deviations in the threshold voltage of the first transistor T1 may be compensated by supplying the data signal DATA that compensates for the threshold voltage to the gate electrode of the first transistor T1 through the third transistor T3.

The gate electrode of the fourth transistor T4 is connected to the third scan line GIL applying the third scan signal GI. A second electrode of the fourth transistor T4 is connected to the first initialization voltage line VINTL for applying the first initialization voltage VINT. The first electrode of the fourth transistor T4 is connected to the first electrode of the storage capacitor Cst, the second electrode of the third transistor T3 and the gate electrode of the first transistor T1. The fourth transistor T4 is turned on in response to the third scan signal GI to transfer the initialization voltage VINT to the gate electrode of the first transistor T1, to initialize the voltage at the gate electrode of the first transistor T1.

The gate electrode of the fifth transistor T5 is connected to the emission control line EML applying the emission control signal EM. The first electrode of the fifth transistor T5 is connected to the first supply voltage line ELVDDL. The second electrode of the fifth transistor T5 is connected to the first electrode of the first transistor T1 and the second electrode of the second transistor T2.

The gate electrode of the sixth transistor T6 is connected to the emission control line EML. The first electrode of the sixth transistor T6 is connected to the second electrode of the first transistor T1 and the first electrode of the third transistor T3. The second electrode of the sixth transistor T6 is connected to the anode electrode of the organic light-emitting diode OLED.

The fifth transistor T5 and the sixth transistor T6 are simultaneously turned on in response to the emission control signal EM so that the driving current flows through the organic light-emitting diode OLED.

The gate electrode of the seventh transistor T7 is connected to the fourth scan line GBL applying the fourth scan signal GB. A first electrode of the seventh transistor T7 is connected to a second initialization voltage line AINTL for applying the second initialization voltage AINTL. A second electrode of the seventh transistor T7 is connected to the anode electrode of the organic light-emitting diode OLED. The seventh transistor T7 is turned on in response to the fourth scan signal GB to initialize the anode electrode of the organic light-emitting diode OLED.

In an embodiment, as shown in FIG. 3, the fourth scan signal GB may be applied to the gate electrode of the seventh transistor T7, but not being limited thereto. Alternatively, the pixel circuit may be configured in a way such that the gate electrode of the seventh transistor T7 is connected to the emission control signal EML in other embodiments. In an embodiment, as shown in FIG. 3, the first electrode of the seventh transistor T7 may be connected to the second initialization voltage line AINTL, but not being limited thereto. Alternatively, the first electrode of the seventh transistor T7 may be connected to the first initialization voltage line VINTL and the second electrode of the fourth transistor T4 in other embodiments.

The second electrode of the storage capacitor Cst is connected to the first supply voltage line ELVDDL. The first electrode of the storage capacitor Cst is connected to the gate electrode of the first transistor T1, the second electrode of the third transistor T3 and the first electrode of the fourth transistor T4. The cathode electrode of the organic light-emitting diode OLED is connected to the second supply voltage line ELVSSL applying the second supply voltage ELVSS. The organic light-emitting diode OLED may receive a driving current from the first transistor T1 to emit light, so that the display device 1 (see FIG. 1) may display an image.

Hereinafter, the arrangement of the pixels PX when viewed from the top will be described in detail with reference to FIGS. 4 to 11.

Figure 4:
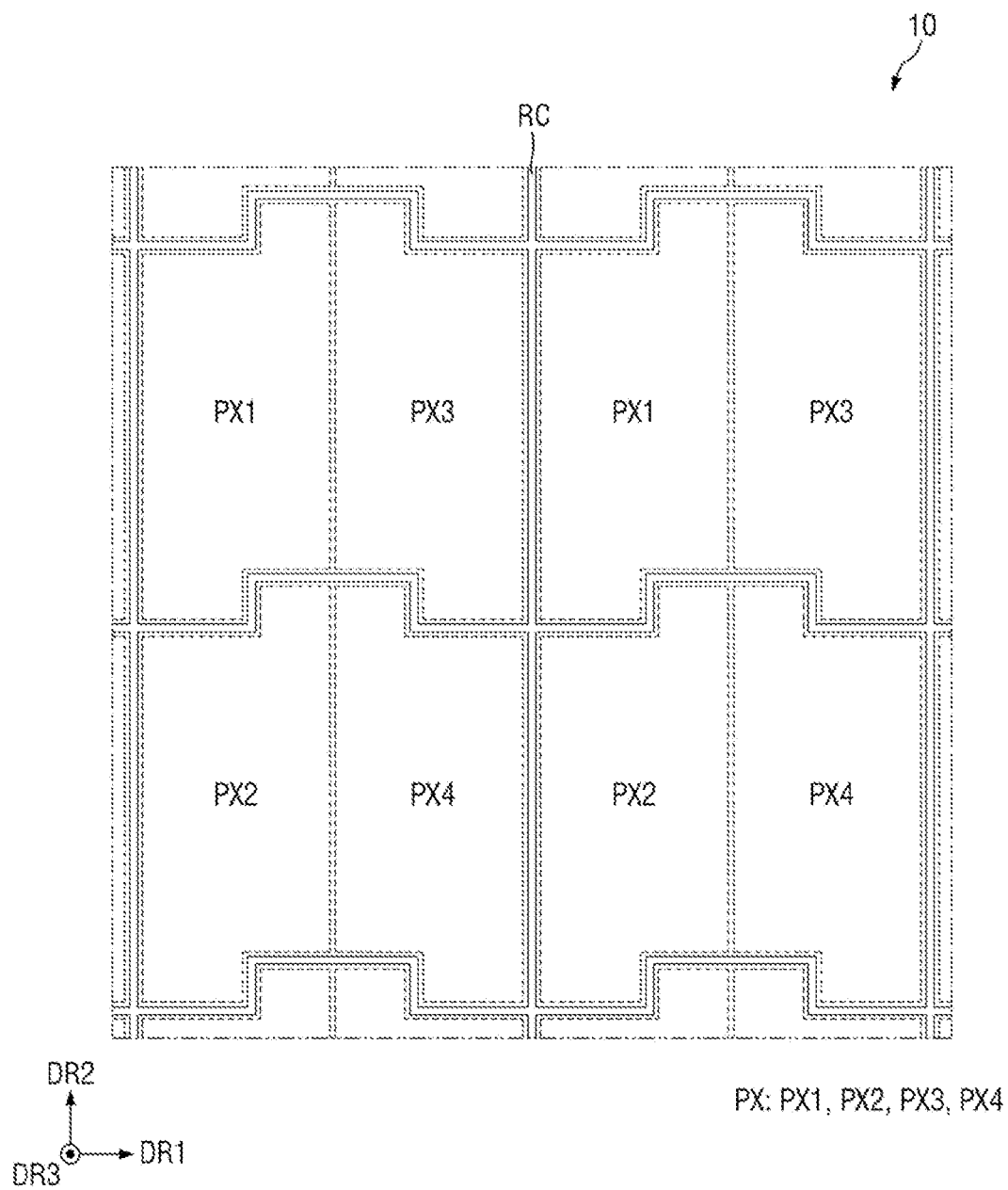
FIG. 4 is a plan view of a plurality of pixels according to an embodiment of the disclosure.
Figure 5:
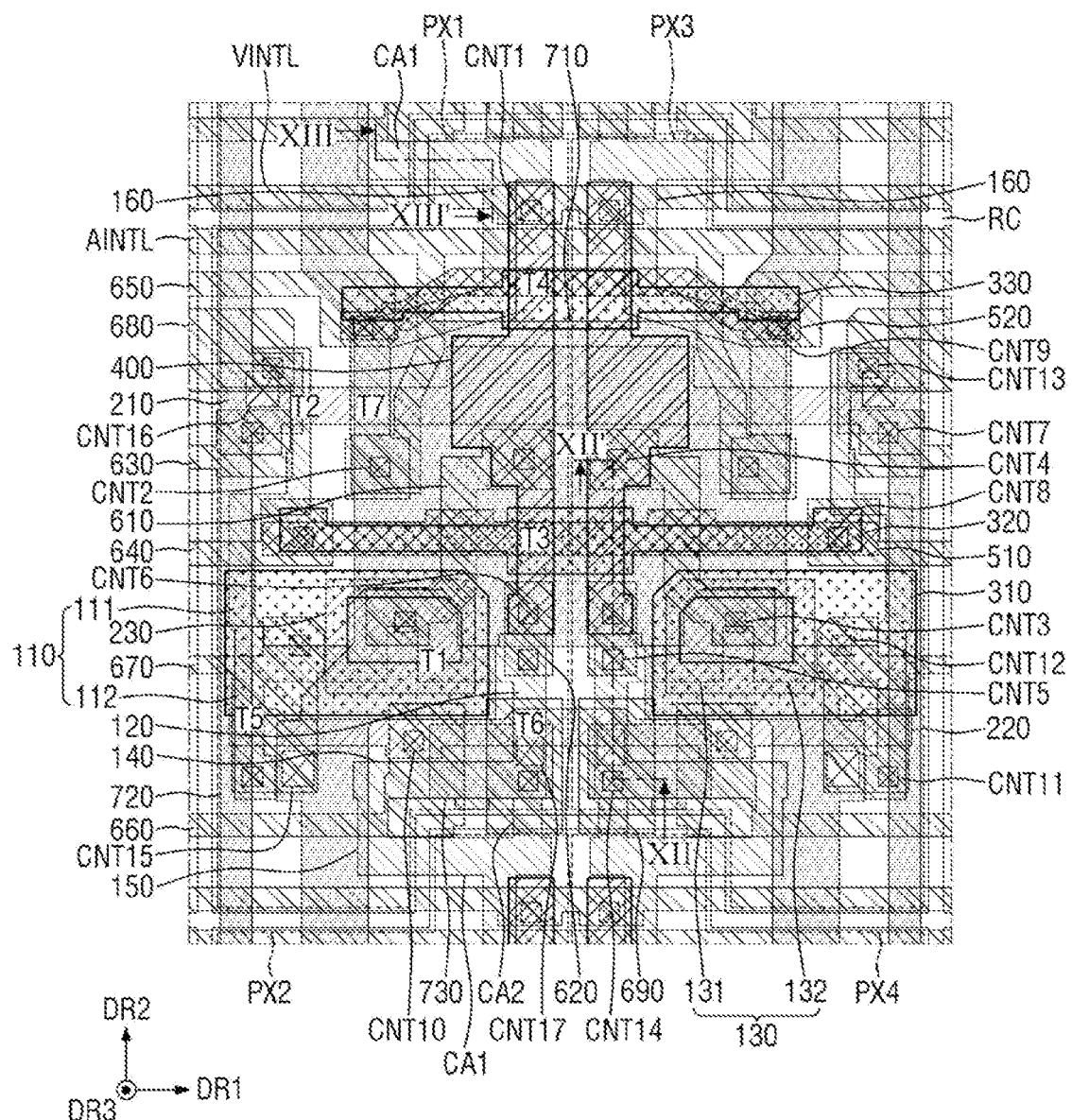
FIG. 5 is an enlarged view of a part of FIG. 4.
Figure 6:
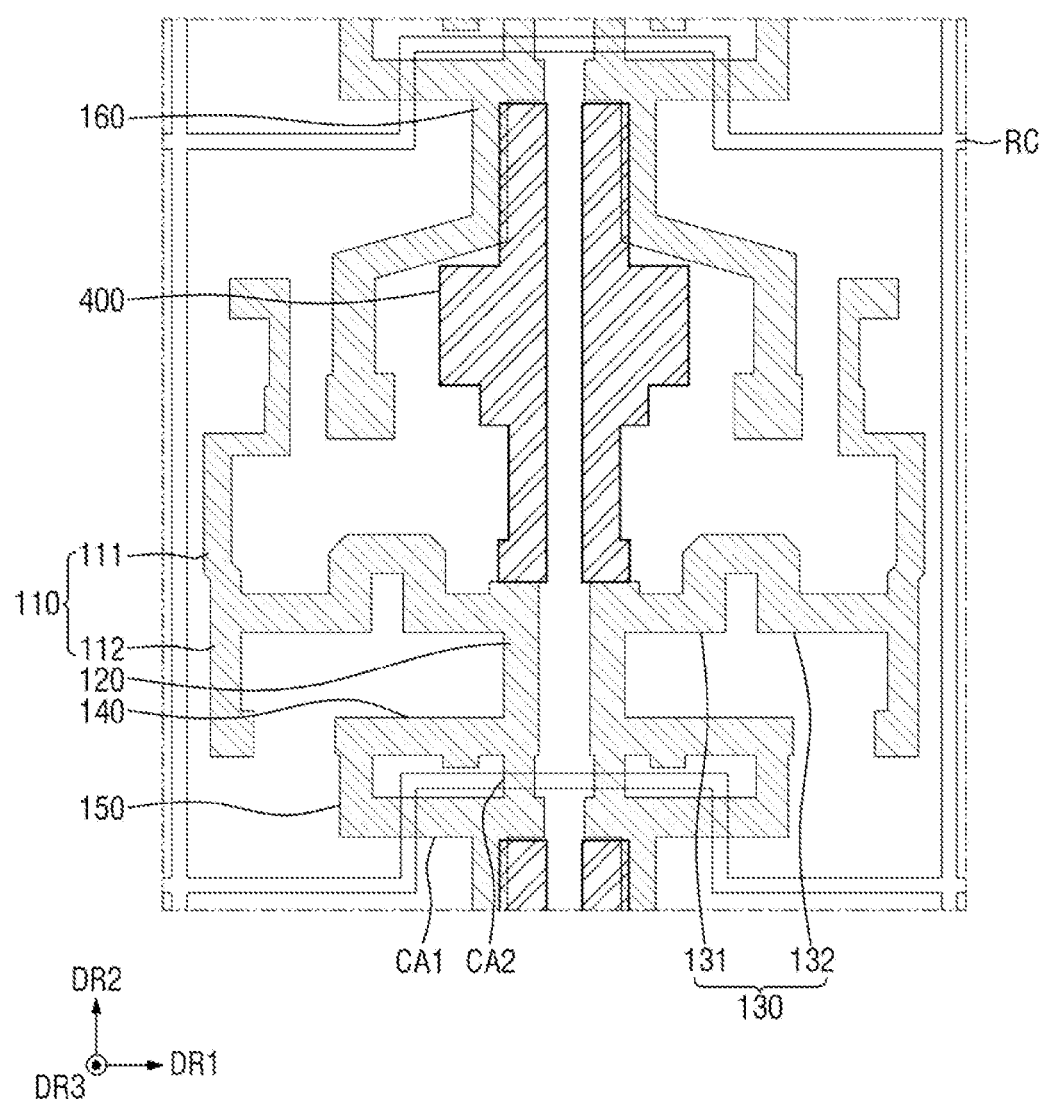
FIG. 6 is a plan view of a first semiconductor layer and a second semiconductor layer of FIG. 5.

FIG. 4 is a plan view of a plurality of pixels according to an embodiment of the disclosure. FIG. 5 is an enlarged view of a part of FIG. 4. FIG. 6 is a plan view of a first semiconductor layer and a second semiconductor layer of FIG. 5.

Referring to FIGS. 4 to 6, in an embodiment as described above, each of the pixels PX includes a plurality of transistors T1 to T7, a storage capacitor Cst (see FIG. 3), and an organic light-emitting diode OLED (see FIG. 3).

The transistors T1 to T7 include a conductive layer that forms (or defines) an electrode, a semiconductor layer that forms a channel, and an insulating layer. Each of the transistors T1 to T7 is a top-gate transistor in which a gate electrode is disposed above a semiconductor layer. The semiconductor layer (first semiconductor layer 100) of the first transistor T1, the second transistor T2, the fifth transistor T5, the sixth transistor T6 and the seventh transistor T7, which are PMOS transistors, and the semiconductor layer (second semiconductor layer 400) of the third transistor T3 and the fourth transistor T4, which are NMOS transistors, may be disposed in different layers from each other and may include different materials from each other.

The storage capacitor Cst includes conductive layers forming (or defining) electrodes and an insulating layer disposed between the conductive layers. The organic light-emitting diode OLED includes conductive layers forming an anode electrode and a cathode electrode, and an organic emissive layer disposed therebetween.

The elements may be electrically connected with one another by lines including or formed of conductive layers and/or vias including or formed of a conductive material. The above-described conductive material, conductive layers, semiconductor layers, insulating layers, organic emissive layer, etc. are disposed on the substrate SUB (see FIG. 12).

In an embodiment, the first scan line GWL (see FIG. 3), the second scan line GCL (see FIG. 3), the third scan line GIL (see FIG. 3), and the emission control line EML (see FIG. 3) may be made up of or defined by two conductive layers. In such an embodiment, the first scan line GWL (see FIG. 3) may include a first scan conductive pattern 210 and a first scan connection pattern 630. The second scan line GCL (see FIG. 3) may include a second scan conductive pattern 510 and a second scan connection pattern 640. The third scan line GIL (see FIG. 3) may include a third scan conductive pattern 520 and a third scan connection pattern 650. The emission control line EML (see FIG. 3) may include an emission control conductive pattern 220 and an emission control connection pattern 660.

The pixels PX may include a first semiconductor layer 100, a first conductive layer 200, a second conductive layer 300, a second semiconductor layer 400, a third conductive layer 500, a fourth conductive layer 600 and a fifth conductive layer 700 stacked on one another sequentially. In an embodiment, the first semiconductor layer 100, the first conductive layer 200, the second conductive layer 300, the second semiconductor layer 400, the third conductive layer 500, the fourth conductive layer 600 and the fifth conductive layer 700 may be stacked on one another in this order in the pixels PX. In an embodiment, insulating layers may be disposed between layers to electrically insulate from one another. The insulating layers may include inorganic insulating layers and organic insulating layers.

The display device 1 (see FIG. 1) may further include a recess pattern RC. The recess pattern RC may be defined by at least some of the insulating layers. In an embodiment, for example, the recess pattern RC may be defined by, but is not limited to, at least some of the inorganic insulating layers. In such an embodiment, the recess pattern RC may be formed by removing at least a portion of some of the inorganic insulating layers.

The pixels PX may include a first pixel PX1, a second pixel PX2, a third pixel PX3 and a fourth pixel PX4. The recess pattern RC may be disposed between the first pixel PX1 and the second pixel PX2 when viewed from the top, and an active layer of the transistor of the first pixel PX1 and an active layer of the second pixel PX2 may be physically and/or electrically connected to each other by the semiconductor layer 100.

The recess pattern RC may surround two pixels PX when viewed from the top. The first pixel PX1 and the third pixel PX3 may be disposed in a same area surrounded by the recess pattern RC when viewed from the top, and the shape of the first pixel PX1 and the shape of the third pixel PX3 may be symmetric to each other when viewed from the top. The second pixel PX2 and the fourth pixel PX4 may be disposed in a same area surrounded by the recess pattern RC when viewed from the top, and the shape of the second pixel PX2 and the shape of the fourth pixel PX4 may be symmetric to each other when viewed from the top. The two pixels PX disposed in one area surrounded by the recess pattern RC may be symmetrical to each other with respect to an imaginary line extended in the first direction DR1, but the disclosure is not limited thereto. In an alternative embodiment, the two pixels PX disposed in one area surrounded by one recess pattern RC may have a shape that is symmetric with each other with respect to an imaginary line extended in the second direction DR2 between the two pixels PX, but the disclosure is not limited thereto.

The first pixel PX1 and the second pixel PX2 may have substantially a same shape as each other when viewed from the top, and the third pixel PX3 and the fourth pixel PX4 may have substantially a same shape as each other when viewed from the top.

The first pixel PX1 and the second pixel PX2 may be alternately and repeatedly arranged in the second direction DR2, and the third pixel PX3 and the fourth pixel PX4 may be alternately and repeatedly arranged in the second direction DR2. The first pixel PX1 and the third pixel PX3 may be alternately and repeatedly arranged in the first direction DR1, and the second pixel PX2 and the fourth pixel PX4 may be alternately and repeatedly arranged in the first direction DR1.

By providing or defining the recess pattern RC between the pixels PX, transmission of an external impact by the inorganic insulating layers may be substantially suppressed or effectively prevented. Accordingly, in such an embodiment, damage to the display panel 10 (see FIG. 1) and the pixels PX due to an external impact may be substantially suppressed or effectively prevented, and furthermore, the reliability of the display device 1 (see FIG. 1) may be improved. Herein, the external impact may be, for example, an impact when the display device 1 (see FIG. 1) is dropped, an impact when a touch input member (a touch pen or a finger) is dropped onto the display device 1 (see FIG. 1)(pen drop), or an impact by a touch of the touch input member, but the disclosure is not limited thereto. A cross-sectional structure of the recess pattern RC will be described later.

The first semiconductor layer 100 is an active layer forming channels of the first transistor T1, the second transistor T2, the fifth transistor T5, the sixth transistor T6 and the seventh transistor T7.

The first semiconductor layer 100 may have a certain pattern when viewed from the top. In an embodiment, as shown in FIG. 6, for example, the first semiconductor layer 100 may include a first vertical portion 110, a second vertical portion 120, a third vertical portion 150, and a fourth vertical portion extended generally in the second direction DR2, and may include a first horizontal portion 130 and a second horizontal portion 140 extended generally in the first direction DR1. The first vertical portion 110, the second vertical portion 120, the third vertical portion 150, the fourth vertical portion 160, the first horizontal portion 130 and the second horizontal pattern portion 140 may be physically connected with one another. The first vertical portion 110, the second vertical portion 120, the third vertical portion 150, the fourth vertical portion 160, the first horizontal portion 130 and the second horizontal portion 140 may be disposed in each of the pixels PX.

The first vertical portion 110 may be disposed adjacent to the left side of the pixel PX, and the second vertical portion 120 may be disposed adjacent to the right side of the pixel PX. The first vertical portion 110 and the second vertical portion 120 may be spaced apart from each other. The first vertical portion 110 may be longer than the second vertical portion 120 in the second direction DR2.

The first horizontal portion 130 may connect the first vertical portion 110 with the second vertical portion 120. The first horizontal portion 130 may connect a middle part of the first vertical portion 110 with the end of the second vertical portion 120 in the second direction DR2. The first horizontal portion 130 may include a first bent portion 131 on the left side and a second bent portion 132 on the right side. The total length of the first horizontal portion 130 may be increased as it is bent several times. It should be understood, however, that the disclosure is not limited thereto.

Alternatively, the first horizontal portion 130 may connect the first vertical portion 110 with the second vertical portion 120 at the shortest distance.

As used herein, an upper part 111 of the first vertical portion 110 may refer to a part located higher than the connection portion with the first horizontal portion 130 when viewed from the top, and a lower part 112 may refer to a part located lower than the connection portion with the first horizontal portion 130 when viewed from the top.

The second horizontal portion 140 may be connected to the other end of the second vertical portion 120 in the second direction DR2, and may be extended from the other end of the second vertical portion 120 in the second direction DR2 toward the first vertical portion 110 in the first direction DR1.

The third vertical portion 150 may be extended from the second horizontal portion 140 in the second direction DR2. In such an embodiment, one end of the second horizontal portion 140 may be connected to the second vertical portion 120, and the other end thereof may be connected to the third vertical portion 150.

The fourth vertical portion 160 may be disposed on one side of the upper part 111 of the first vertical portion 110 in the first direction DR1, and may be connected generally in the second direction DR2.

The first semiconductor layer 100 may be extended to the neighboring pixels PX beyond the boundary between the adjacent pixels PX. The first semiconductor layer 100 may be extended to the neighboring pixels PX in the second direction DR2 beyond the boundary between the pixels PX. In such an embodiment, the first semiconductor layer 100 may intersect the recess pattern RC when viewed from the top, and the first semiconductor layer 100 may overlap the recess pattern RC between adjacent pixels PX. Accordingly, even though the recess pattern RC is disposed between the pixels PX, the conductive patterns electrically connecting the pixels PXs adjacent to each other with the recess patterns RC therebetween may be reduced, so that a sufficient space may be provided for designing the layout of the pixels PX. In such an embodiment, an area in which the conductive layers are disposed between adjacent pixels PX may be reduced, and thus more pixels PX may be disposed in a same area of the display area DA (see FIG. 1), so that the display device 1 (see FIG. 1) may be improved.

In an embodiment, the first semiconductor layer 100 may further include a first semiconductor connection pattern CA1 and a second semiconductor connection pattern CA2. The first semiconductor connection pattern CA1 may be extended in the first direction DR1, and the second semiconductor connection pattern CA2 may be extended in the second direction DR2.

Between the pixels PX adjacent to each other in the second direction DR2, the first semiconductor layer 100 may intersect the recess pattern RC at a location where the recess pattern RC is extended in different directions when viewed from the top. In an embodiment, for example, the first semiconductor connection pattern CA1 may be extended in the first direction DR1 and may intersect the recess pattern RC extended in the second direction DR2. In such an embodiment, the second semiconductor connection pattern CA2 may be extended in the second direction DR2, and may intersect the recess pattern RC extended in the first direction DR1.

In an embodiment, the first semiconductor connection pattern CA1 may connect the fourth vertical portion 160 of the second pixel PX2 with the third vertical portion 150 of the first pixel PX1. The second pixel PX2 and the first pixel PX1 may be adjacent to each other in the second direction DR2, and the recess pattern RC may be disposed between the second pixel PX2 and the first pixel PX1. The first semiconductor connection pattern CA1 may intersect the recess pattern RC and may overlap the recess pattern RC where a portion thereof intersects the recess pattern RC.

The second semiconductor connection pattern CA2 may connect the fourth vertical portion 160 of the second pixel PX2 with the second vertical portion 120 of the first pixel PX1 adjacent to the second pixel PX2. The second pixel PX2 and the first pixel PX1 may be adjacent to each other in the first direction DR1, and the recess pattern RC may be disposed between the second pixel PX2 and the first pixel PX1. The second semiconductor connection pattern CA2 may intersect the recess pattern RC and may overlap the recess pattern RC where a portion thereof intersects the recess pattern RC.

The first semiconductor connection pattern CA1 and the second semiconductor connection pattern CA2 may be formed integrally with the second vertical portion 120, the third vertical portion 150 and the fourth vertical portion 160. It should be understood, however, that the disclosure is not limited thereto.

The first semiconductor connection pattern CA1 and the second semiconductor connection pattern CA2 may electrically connect the sixth transistor T6 of the second pixel PX2 with the seventh transistor T7 of the first pixel PX1 adjacent to the second pixel PX2. In such an embodiment, the sixth transistor T6 of one of two pixels PX adjacent to each other in the second direction DR2 may be electrically connected to the seventh transistor T7 of the other one via the first semiconductor connection pattern CA1 and the second semiconductor connection pattern CA2.

As the active layers of the adjacent pixels PX are connected via the first semiconductor connection pattern CA1 and the second semiconductor connection pattern CA2 across the recess pattern RC, even if one of the first semiconductor connection pattern CA1 and the second semiconductor connection pattern CA2 is disconnected due to an external impact, the active layers of the adjacent pixels PX may still be connected via the other of the first semiconductor connection pattern CA1 and the second semiconductor connection pattern CA2. Accordingly, the reliability of the display panel 10 (see FIG. 1) can be improved.

The channels of the first transistor T1, the second transistor T2, the fifth transistor T5, the sixth transistor T6 and the seventh transistor T7 may be located where the first semiconductor layer 100 overlaps the gate electrodes of the transistors T1, T2, T5, T6 and T7 in the thickness direction (the third direction DR3), respectively.

The channel of the first transistor T1 may be disposed at the first horizontal portion 130. The channel of the second transistor T2 may be disposed at the upper part 111 of the first vertical portion 110, and the channel of the fifth transistor T5 may be disposed at the lower part 112 of the first vertical portion 110. The channel of the sixth transistor T6 may be disposed at the second vertical portion 120, and the channel of the seventh transistor T7 may be disposed at the fourth vertical portion 160.

The first semiconductor layer 100 may include polycrystalline silicon. The polycrystalline silicon may be formed by crystallizing amorphous silicon. In an embodiment, a method of the crystallizing amorphous silicon may include, but is not limited to, rapid thermal annealing ("RTA"), solid phase crystallization ("SPC"), excimer laser annealing ("ELA"), metal induced crystallization ("MIC"), metal induced lateral crystallization ("MILC"), sequential lateral solidification ("SLS"), etc. Alternatively, the first semiconductor layer 100 may include monocrystalline silicon, low-temperature polycrystalline silicon, amorphous silicon, or the like.

The portions of the first semiconductor layer 100 that are connected to the source/drain electrodes of each of the transistors T1, T2, T5, T6 and T7 may be doped with impurity ions (p-type impurity ions in case of PMOS transistors). In an embodiment, for example, a trivalent dopant such as boron (B) may be used as the p-type impurity ions.

The second semiconductor layer 400 is an active layer forming the channels of the third transistor T3 and the fourth transistor T4. The channels of the third transistor T3 and the fourth transistor T4 may be located where the second semiconductor layer 400 overlaps the gate electrodes of the transistors T3 and T4 in the thickness direction (the third direction DR3), respectively. The channel of the third transistor T3 and the channel of the fourth transistor T4 may be disposed on the second semiconductor layer 400. The channel of the third transistor T3 may be disposed closer to the second vertical portion 120 of the first semiconductor layer 100 than the channel of the fourth transistor T4 when viewed from the top. The channel of the third transistor T3 may be located on a lower side of the pixel PX than the channel of the fourth transistor T4 when viewed from the top.

The second semiconductor layer 400 may be disposed separately in each of the pixels. The first semiconductor layer 100 may have a certain pattern when viewed from the top. In an embodiment, for example, the second semiconductor layer 400 may include an island shape extended generally in the second direction DR2. The second semiconductor layer 400 may be disposed on the upper side of the first semiconductor layer 100 when viewed from the top. The second semiconductor layer 400 may be disposed on one side of the second vertical portion 120 of the first semiconductor layer 100 in the second direction DR2. The second semiconductor layer 400 may be disposed on the right side of the pixel PX. The fourth vertical portion 160 of the first semiconductor layer 100 may be disposed between the second semiconductor layer 400 and the upper part 111 of the first vertical portion 110 of the first semiconductor layer 100.

The second semiconductor layer 400 may include an oxide semiconductor. In an embodiment, the second semiconductor layer 400 may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. According to an embodiment of the disclosure, the second semiconductor layer 400 may include an oxide including indium, titanium and tin ("ITZO") or an oxide including indium, gallium and tin ("IGZO").

Most regions of the second semiconductor layer 400 may be doped with impurity ions (n-type impurity ions in case of an NMOS transistor). In an embodiment, for example, trivalent dopants such as phosphorus (P) may be used as the n-type impurity ions. Accordingly, most regions of the second semiconductor layer 400 doped with n-type impurity ions have low electrical resistance and high conductivity, thereby acting like a conductive material. However, in the second semiconductor layer 400, the channel region of the third transistor T3 and the channel region of the fourth transistor T4 may not be doped or may be doped at a relatively low concentration.

Figure 7:
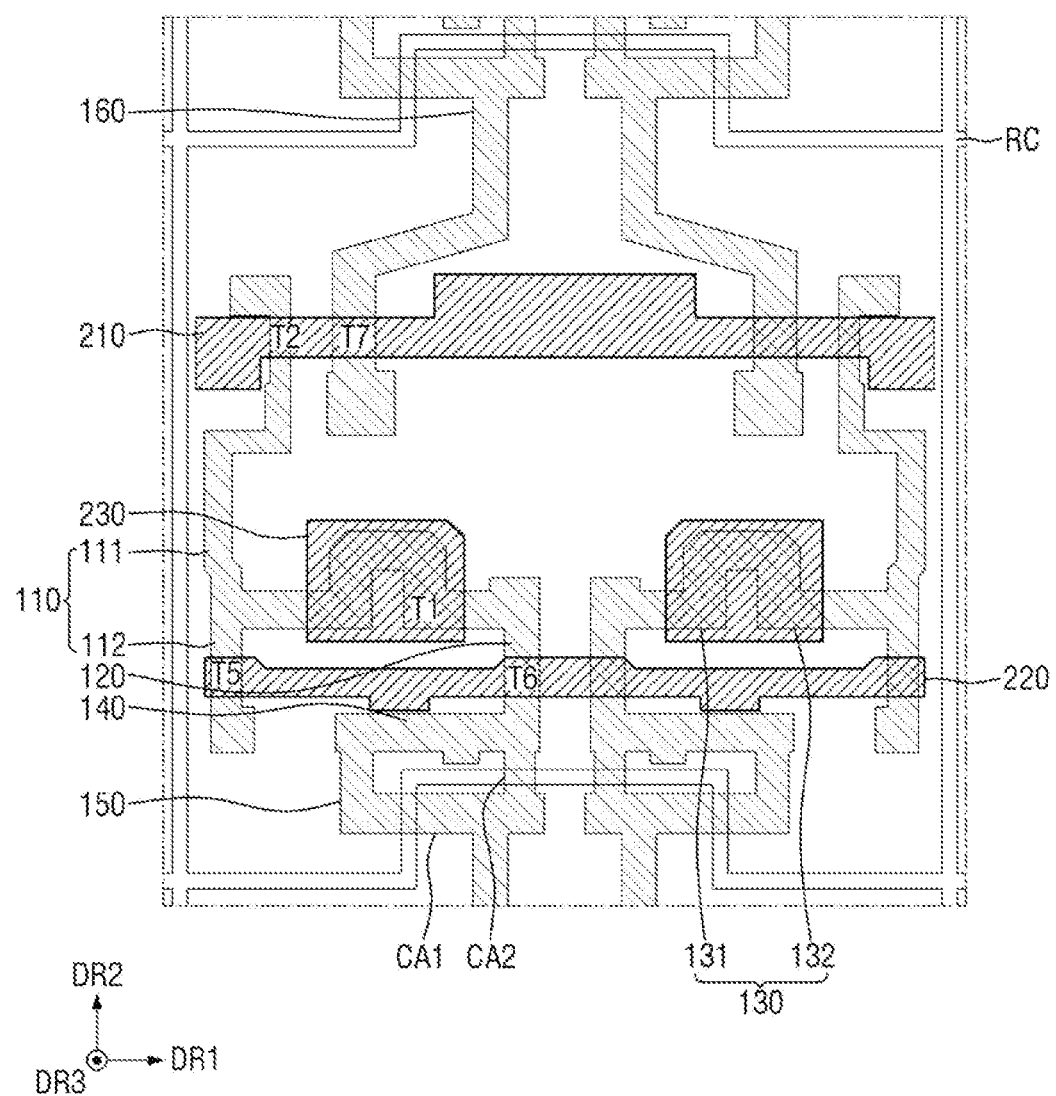
FIG. 7 is a plan view of the first semiconductor layer and the first conductive layer of FIG. 5.

FIG. 7 is a plan view of the first semiconductor layer and the first conductive layer of FIG. 5.

Referring to FIGS. 5 and 7, the first conductive layer 200 may include the first scan conductive pattern 210 of the first scan line GWL, the emission control conductive pattern 220 of the emission control line EML, and a gate electrode 230 of the first transistor T1.

The first scan conductive pattern 210 may include the gate electrode of the second transistor T2 and the gate electrode of the seventh transistor T7, and The emission control conductive pattern 220 may include the gate electrode of the fifth transistor T5 and the gate electrode of the sixth transistor T6.

Each of the first scan conductive pattern 210 and the emission control conductive pattern 220 may be extended in the first direction DR1. Each of the first scan conductive pattern 210 and the emission control conductive pattern 220 may be disposed in an area surrounded by the recess pattern RC. Each of the first scan conductive pattern 210 and the emission control conductive pattern 220 may be disposed in every area surrounded by the recess pattern RC.

The first scan conductive patterns 210 of the pixels PX adjacent to each other in the first direction DR1 may be electrically connected with each other by the first scan connection pattern 630 of the fourth conductive layer 600 traversing the recess pattern RC. The emission control conductive patterns 220 of the pixels PX adjacent to each other in the first direction DR1 may be electrically connected with each other by the emission control connection pattern 660 of the fourth conductive layer 600 traversing the recess pattern RC. Accordingly, each of the first scan line GWL and the emission control line EML may be extended to neighboring pixels beyond the boundary of the pixels in the first direction DR1.

The first scan conductive pattern 210 may be located around the center of the pixel. The first scan conductive pattern 210 may overlap the upper part 111 of the first vertical portion 110 of the first semiconductor layer 100 and the fourth vertical portion 160, and may form or define the gate electrode of the second transistor T2 and the gate electrode of the seventh transistor T7 at the locations where portions thereof overlaps the upper part 111 and the fourth vertical portion 160.

In an embodiment, a part of the first vertical portion 110 of the first semiconductor layer 100 located higher than the location where the first scan conductive pattern 210 overlaps the upper part 111 of the first vertical portion 110 when viewed from the top may become (or define) the first electrode region of the second transistor T2, while a part of the first vertical portion 110 of the first semiconductor layer 100 located lower than the location where the first scan conductive pattern 210 overlaps the upper part 111 of the first vertical portion 110 when viewed from the top may become the second electrode region of the second transistor T2.

In an embodiment, a part of the fourth vertical portion 160 of the first semiconductor layer 100 located lower than the location where the first scan conductive pattern 210 overlaps the fourth vertical portion 160 when viewed from the top may become the first electrode region of the seventh transistor T7, while a part of the fourth vertical portion 160 of the first semiconductor layer 100 located higher than the location where the first scan conductive pattern 210 overlaps the fourth vertical portion 160 when viewed from the top may become the second electrode region of the seventh transistor T7.

The emission control conductive pattern 220 may be located lower than the first scan conductive pattern 210 when viewed from the top, and may overlap the lower part 112 of the first vertical portion 110 of the first semiconductor layer 100 and the second vertical portion 120.

The emission control conductive pattern 220 may form or define the gate electrode of the fifth transistor T5 at a location where the emission control conductive pattern 220 overlaps the lower part 112 of the first vertical portion 110 of the first semiconductor layer 100. In an embodiment, a part of the first vertical portion 110 of the first semiconductor layer 100 located higher than the location where the emission control conductive pattern 220 and the lower part 112 of the first vertical portion 110 of the first semiconductor layer 100 overlap each other when viewed from the top may become the second electrode region of the fifth transistor T5, while a part of the first vertical portion 110 of the first semiconductor layer 100 located lower than the location where the emission control conductive pattern 220 and the lower part 112 of the first vertical portion 110 of the first semiconductor layer 100 overlap each other when viewed from the top may become the first electrode region of the fifth transistor T5.

The emission control conductive pattern 220 may form or define the gate electrode of the sixth transistor T6 at a location where the emission control conductive pattern 22 overlaps the second vertical portion 120. In an embodiment, a part of the second vertical portion 120 of the first semiconductor layer 100 located higher than the location where the emission control conductive pattern 22 overlaps the second vertical portion 120 when viewed from the top may become the first electrode region of the sixth transistor T6, while a part of the second vertical portion 120 of the first semiconductor layer 100 located lower than the location where the emission control conductive pattern 22 overlaps the second vertical portion 120 when viewed from the top may become the second electrode region of the sixth transistor T6.

The gate electrode 230 of the first transistor T1 may be located at the center of the pixel. The gate electrode 230 of the first transistor T1 may be located between the first scan conductive pattern 210 and the emission control conductive pattern 220 when viewed from the top. The gate electrode 230 of the first transistor T1 may be disposed separately in each of the pixels PX.

The gate electrode 230 of the first transistor T1 overlaps the first horizontal portion 130 of the first semiconductor layer 100. In an embodiment, a part of the first horizontal portion 130 of the first semiconductor layer 100 located on the left side of the location where the gate electrode 230 of the first transistor T1 and the first horizontal portion 130 of the first semiconductor layer 100 overlap each other may become the first electrode region of the first transistor T1, while a part of the first horizontal portion 130 of the first semiconductor layer 100 located on the right side of the location where the gate electrode 230 of the first transistor T1 and the first horizontal portion 130 of the first semiconductor layer 100 overlap each other may become the second electrode region of the first transistor T1.

The first conductive layer 200 may include at least one metal selected from: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

Figure 8:
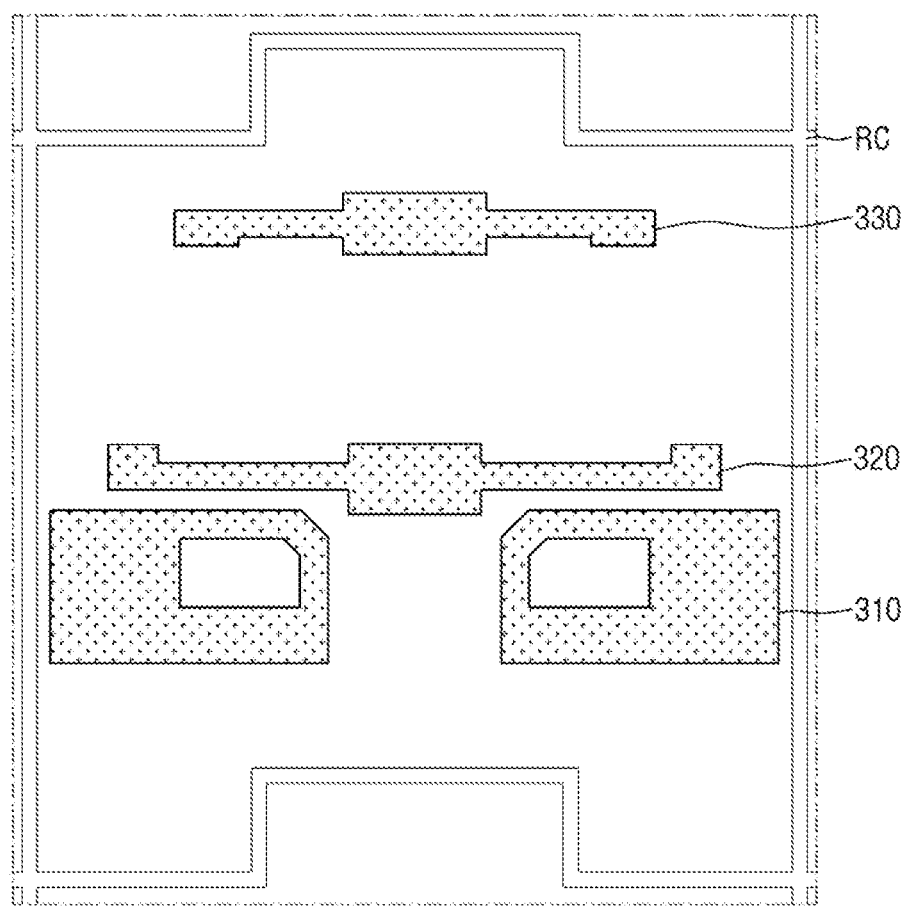
FIG. 8 is a plan view of the fifth conductive layer of FIG. 5.

FIG. 8 is a plan view of the second conductive layer of FIG. 5.

Referring to FIGS. 5 and 8, the second conductive layer 300 may include a second electrode 310 of the storage capacitor Cst, a first light-blocking pattern 320, and a second light-blocking pattern 330.

The second electrode 310 of the storage capacitor Cst may be located at the center of the pixel PX. The second electrode 310 of the storage capacitor Cst may be located between the first scan conductive pattern 210 and the emission control conductive pattern 220 when viewed from the top. The second electrode 310 of the storage capacitor Cst may be disposed separately in each of the pixels.

The second electrode 310 of the storage capacitor Cst may overlap the gate electrode 230 of the first transistor T1 in the thickness direction (the third direction DR3). The gate electrode 230 of the first transistor T1 may be extended from the location where the gate electrode 230 of the first transistor T1 overlaps the first semiconductor layer 100 and may form or define the first electrode of the storage capacitor Cst at a location where the gate electrode 230 of the first transistor T1 overlaps the second electrode 310 of the storage capacitor Cst in thickness direction (the third direction DR3). In such an embodiment, the gate electrode 230 of the first transistor T1 may be connected to the first electrode of the storage capacitor Cst. The first electrode of the storage capacitor Cst may be formed of or defined by the gate electrode 230 of the first transistor T1 itself or a portion extended from the gate electrode 230 of the first transistor T1. In an embodiment, an opening may be defined in the second electrode 310 of the storage capacitor Cst to overlap the gate electrode 230 of the first transistor T1 thereunder.

The first light-blocking pattern 320 may be located at the center of the pixel PX. The first light-blocking pattern 320 may be located between the second electrode 310 of the storage capacitor Cst and the second light-blocking pattern 330 when viewed from the top. The first light-blocking pattern 320 may be disposed separately in each of the pixels.

The second light-blocking pattern 330 may be located near the upper side of the pixel PX when viewed from the top. The second light-blocking pattern 330 may be located on the upper side of the first light-blocking pattern 320 and the second electrode 310 of the storage capacitor Cst when viewed from the top. The second light-blocking pattern 330 may be disposed separately in each of the pixels.

The first light-blocking pattern 320 may overlap the channel of the third transistor T3 in the thickness direction (the third direction DR3), and the second light-blocking pattern 330 may overlap the channel of the fourth transistor T4 in the thickness direction (the third direction DR3). The first light-blocking pattern 320 and the second light-blocking pattern 330 may be located under the second semiconductor layer 400, and can prevent light incident from below the second semiconductor layer 400 from entering the channel of the third transistor T3 and the channel the fourth transistor T4.

The second conductive layer 300 may include, but is not limited to, a same material as the first conductive layer 200. In an embodiment, for example, the second conductive layer 300 may include at least one selected from the above-described materials with respect to the first conductive layer 200.

Figure 9:
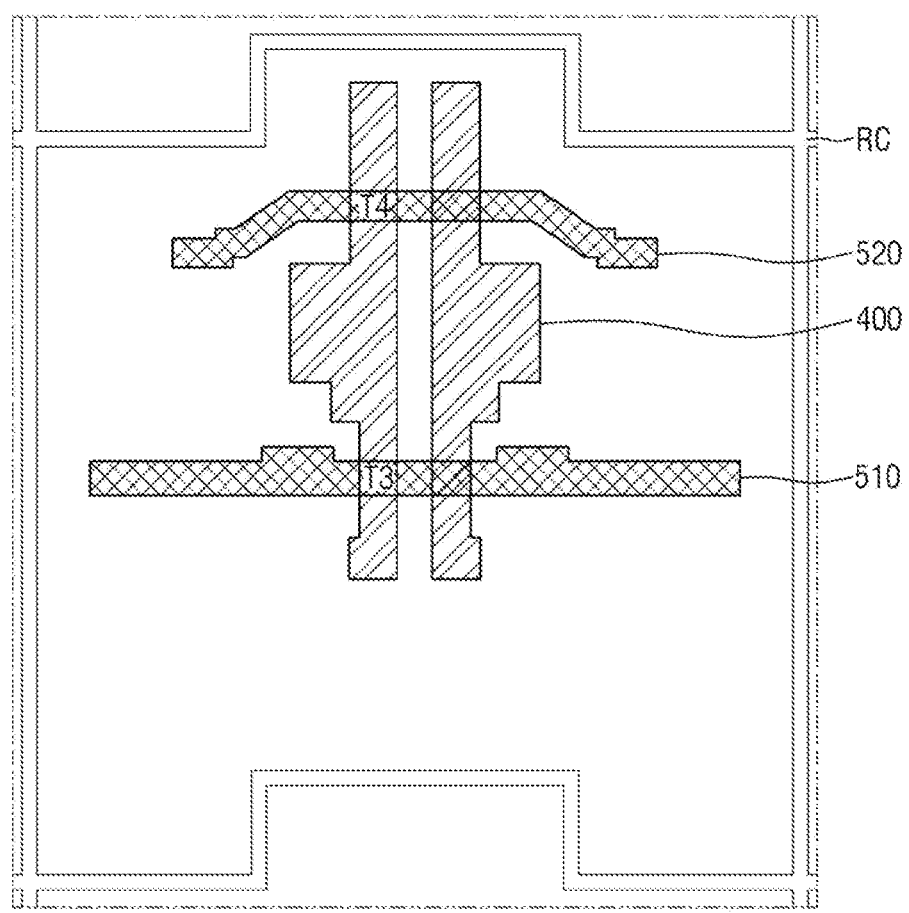
FIG. 9 is a plan view of the second semiconductor layer and the third conductive layer of FIG. 5.

FIG. 9 is a plan view of the second semiconductor layer and the third conductive layer of FIG. 5.

Referring to FIGS. 5 and 9, the third conductive layer 500 may include a second scan conductive pattern 510 of the second scan line GCL and a third scan conductive pattern 520 of the third scan line GIL.

The second scan conductive pattern 510 may include the gate electrode of the third transistor T3, and the third scan conductive pattern 520 may include the gate electrode of the fourth transistor T4.

Each of the second scan conductive pattern 510 and the third scan conductive pattern 520 may be extended in the first direction DR1. Each of the second scan conductive pattern 510 and the third scan conductive pattern 520 may be disposed in an area surrounded by the recess pattern RC. Each of the second scan conductive pattern 510 and the third scan conductive pattern 520 may be disposed in every area surrounded by the recess pattern RC.

The second scan conductive patterns 510 of the pixels PX adjacent to each other in the first direction DR1 may be electrically connected with each other by the second scan connection pattern 640 of the fourth conductive layer 600 traversing the recess pattern RC. The third scan conductive patterns 520 of the pixels PX adjacent to each other in the first direction DR1 may be electrically connected with each other by the third scan connection pattern 650 of the fourth conductive layer 600 traversing the recess pattern RC. Accordingly, each of the second scan line GCL and the third scan line GIL may be extended to neighboring pixels beyond the boundary of the pixels in the first direction DR1.

The second scan conductive pattern 510 may be located around the center of the pixel. The second scan conductive pattern 510 may overlap the second semiconductor layer 400 and may form or define the gate electrode of the third transistor T3 at the location where the second scan conductive pattern 510 and the second semiconductor layer 400 overlap each other.

in an embodiment, a part of the second semiconductor layer 400 located higher than the location where the second scan conductive pattern 510 overlaps the second semiconductor layer 400 when viewed from the top may become the first electrode region of the third transistor T3, while a part of the second semiconductor layer 400 located lower than the location where the second scan conductive pattern 510 overlaps the second semiconductor layer 400 when viewed from the top may become the second electrode region of the third transistor T3.

The third scan conductive pattern 520 may be located higher than the second scan conductive pattern 510 when viewed from the top, may overlap the second semiconductor layer 400, and may form or define the gate electrode of the fourth transistor T4 at the location where they overlap each other.

The third scan conductive pattern 520 may form or define the gate electrode of the fourth transistor T4 at the location where the third scan conductive pattern 520 overlaps the second semiconductor layer 400. In an embodiment, a part of the second semiconductor layer 400 located higher than the location where the third scan conductive pattern 520 and the second semiconductor layer 400 overlap each other when viewed from the top may become the first electrode region of the fourth transistor T4, while a part of the second semiconductor layer 400 located lower than the location where the third scan conductive pattern 520 and the second semiconductor layer 400 overlap each other when viewed from the top may become the second electrode region of the seventh transistor T7.

The third conductive layer 500 may include, but is not limited to, the same material as the first conductive layer 200. In an embodiment, for example, the third conductive layer 500 may include at least one selected from the above-described materials with respect to the first conductive layer 200.

Figure 10:
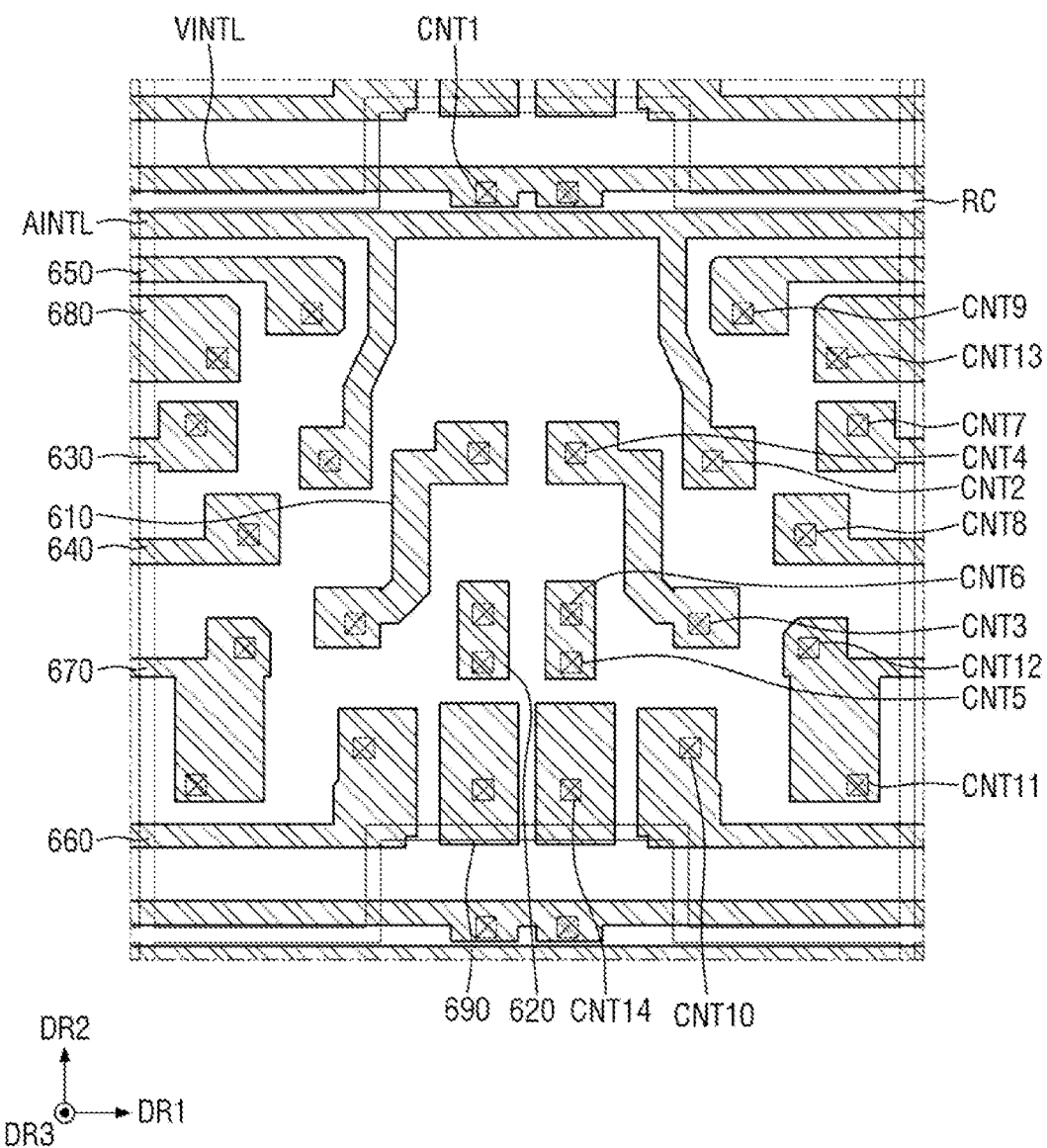
FIG. 10 is a plan view of the fifth conductive layer of FIG. 5.

FIG. 10 is a plan view of the fourth conductive layer of FIG. 5.

Referring to FIGS. 5 and 10, the fourth conductive layer 600 may include the first electrode and the second electrode of each of the transistors T1 to T7. The voltage line and the plurality of connection patterns included in the fourth conductive layer 600 may form or define the first electrode or the second electrode of at least one of the transistors T1 to T7. The fourth conductive layer 600 may include the first initialization voltage line VINTL, the second initialization voltage line AINTL, and a plurality of connection patterns 610, 620, 630, 640, 650, 660, 670, 680 and 690.

Each of the first initialization voltage line VINTL and the second initialization voltage line AINTL may be extended in the first direction DR1. Each of the first initialization voltage line VINTL and the second initialization voltage line AINTL may be extended to neighboring pixels beyond the boundary of the pixels in the first direction DR1.

The first initialization voltage line VINTL may be located on the upper side of the first scan conductive pattern 210 when viewed from the top. The first initialization voltage line VINTL may overlap the second semiconductor layer 400 in the thickness direction (the third direction DR3). The location where the first initialization voltage line VINTL and the second semiconductor layer 400 overlap each other may be located at one end of the second semiconductor layer 400 in the second direction DR2. At the location where the first initialization voltage line VINTL and the second semiconductor layer 400 overlap each other, the first initialization voltage line VINTL may penetrate or be disposed through the insulating film disposed between the first initialization voltage line VINTL and the second semiconductor layer 400 and may be in contact with the second semiconductor layer 400 through a contact hole CNT1 defined through the insulating film to expose the second semiconductor layer 400. In such an embodiment, the first initialization voltage line VINTL may be electrically connected to the second semiconductor layer 400 through the contact hole CNT1.

The second initialization voltage line AINTL may be located lower than the first initialization voltage line VINTL when viewed from the top. The second initialization voltage line AINTL may overlap the fourth vertical portion 160 of the first semiconductor layer 100 in the thickness direction (the third direction DR3). In an embodiment, the second initialization voltage line AINTL may include a base portion extended generally in the first direction DR1 and a protrusion protruding generally in the second direction DR2 from the base portion. The protrusion of the second initialization voltage line AINTL may traverse the first scan conductive pattern 210, the second light-blocking pattern 330 and the third scan conductive pattern 520, and may overlap one end of the fourth vertical portion 160 of the first semiconductor layer 100. At the location where the protrusion of the second initialization voltage line AINTL and the one end of the fourth vertical portion 160 of the first semiconductor layer 100 overlap each other, the second initialization voltage line AINTL may penetrate or be disposed through the insulating film disposed between the second initialization voltage line AINTL and the fourth vertical portion 160 of the first semiconductor layer 100 and may be in contact with the fourth vertical portion 160 of the first semiconductor layer 100 through a contact hole CNT2 defined through the insulating film to expose the fourth vertical portion 160 of the first semiconductor layer 100. In such an embodiment, the second initialization voltage line AINTL may be electrically connected to the fourth vertical portion 160 of the first semiconductor layer 100 through the contact hole CNT2.

The plurality of connection patterns 610, 620, 630, 640, 650, 660, 670, 680 and 690 may include the first connection pattern 610, the second connection pattern 620, the first scan connection pattern 630, the second scan connection pattern 640, the third scan connection pattern 650, the emission control connection pattern 660, the first supply voltage connection pattern 670, the data connection pattern 680, and the first anode connection pattern 690. The plurality of connection patterns 610, 620, 630, 640, 650, 660, 670, 680 and 690 are physically spaced apart from one another. The plurality of connection patterns 610, 620, 630, 640, 650, 660, 670, 680 and 690 may electrically connect portions separated from one another to one another.

The first connection pattern 610 may overlap the gate electrode 230 of the first transistor T1. The first connection pattern 610 may be electrically connected to the gate electrode 230 of the first transistor T1 through the contact hole CNT3 at the located where the first connection pattern 610 and the gate electrode 230 of the first transistor T1 overlap each other. The contact hole CNT3 may be located in the opening of the second electrode 310 of the storage capacitor Cst. An insulating layer may be disposed between the first connection pattern 610 inside the contact hole CNT3 and the second electrode 310 of the storage capacitor Cst adjacent thereto, to insulate the first connection pattern 610 and the second electrode 310 of the storage capacitor Cst from each other.

The first connection pattern 610 may also be extended from the location where the first connection pattern 610 overlaps the gate electrode 230 of the first transistor T1 toward the upper side to intersect with the second scan conductive pattern 510 and to be insulated from the second scan conductive pattern 510, and may overlap the second semiconductor layer 400. At the location where the first connection pattern 610 and the gate electrode 230 of the first transistor T1 overlap each other, the first connection pattern 610 may penetrate or be disposed through the insulating film disposed between the first connection pattern 610 and the second semiconductor layer 400 and may be in contact with the second semiconductor layer 400 through a contact hole CNT4 defined through the insulating film to expose the second semiconductor layer 400. In such an embodiment, the first connection pattern 610 may be electrically connected to the second semiconductor layer 400 through the contact hole CNT4. Accordingly, the gate electrode 230 of the first transistor T1 may be electrically connected to the second semiconductor layer 400 through the first connection pattern 610.

The second connection pattern 620 may overlap the second vertical portion 120 of the first semiconductor layer 100. At the location where the second connection pattern 620 and the second vertical portion 120 of the first semiconductor layer 100 overlap each other, the second connection pattern 620 may penetrate or be disposed through the insulating layer disposed between the second connection pattern 620 and the second vertical portion 120 of the first semiconductor layer 100 and may be in contact with the second vertical portion 120 of the first semiconductor layer 100 through a contact hole CNT5 defined through the insulating layer to expose the second vertical portion 120 of the first semiconductor layer 100. In such an embodiment, the second connection pattern 620 may be electrically connected to the second vertical portion 120 of the first semiconductor layer 100 through the contact hole CNT5.

In an embodiment, the second connection pattern 620 may overlap the second semiconductor layer 400. At the location where the second connection pattern 620 and the second semiconductor layer 400 overlap each other, the second connection pattern 620 may penetrate or be disposed through the insulating layer disposed between the second connection pattern 620 and the second semiconductor layer 400 and may be in contact with the second semiconductor layer 400 through a contact hole CNT6 defined through the insulating layer to expose the second semiconductor layer 400. In such an embodiment, the second connection pattern 620 may be electrically connected to the second semiconductor layer 400 through the contact hole CNT6. Accordingly, the first semiconductor layer 100 may be electrically connected to the second semiconductor layer 400 via the second connection pattern 620.

The first scan connection pattern 630 may be extended in the first direction DR1 and may traverse the recess pattern RC extended in the second direction DR2. The first scan connection pattern 630 may overlap the first scan conductive pattern 210 in the thickness direction (the third direction DR3). The first scan connection pattern 630 may overlap one end and the other end of the first scan conductive pattern 210.

At the location where the first scan connection pattern 630 and the one end and the other end of the first scan conductive pattern 210 overlap each other, the first scan connection pattern 630 may penetrate or be disposed through the insulating layer disposed between the first scan connection pattern 630 and the first scan conductive pattern 210 and may be in contact with the first scan conductive pattern 210 through a contact hole CNT7 defined through the insulating layer to expose the first scan conductive pattern 210. In other words, the first scan connection pattern 630 may be electrically connected to the first scan conductive pattern 210 through the contact hole CNT7. At the location where the first scan connection pattern 630 and the one end and the other end of the first scan conductive pattern 210 overlap each other, the first scan connection pattern 630 may be extended toward one side or the other side in the first direction DR1 to traverse the recess pattern RC, may overlap the adjacent first scan conductive pattern 210 and may be in contact with the adjacent first scan conductive pattern 210 through the contact hole CNT7.

Accordingly, among the first scan conductive patterns 210 of the pixels PX adjacent to each other in the first direction DR1, the first scan conductive patterns 210 which are separated from each other and have the recess pattern RC disposed therebetween may be electrically connected with each other via the first scan connection pattern 630.

The second scan connection pattern 640 may be extended in the first direction DR1 and may traverse the recess pattern RC extended in the second direction DR2. The second scan connection pattern 640 may overlap the second scan conductive pattern 510 in the thickness direction (the third direction DR3). The second scan connection pattern 640 may overlap one end and the other end of the second scan conductive pattern 510.

At the location where the second scan connection pattern 640 and the one end and the other end of the second scan conductive pattern 510 overlap each other, the second scan connection pattern 640 may penetrate or be disposed through the insulating layer disposed between the second scan connection pattern 640 and the second scan conductive pattern 510 and may be in contact with the second scan conductive pattern 510 through a contact hole CNT8 defined through the insulating layer to expose the second scan conductive pattern 510. In such an embodiment, the second scan connection pattern 640 may be electrically connected to the second scan conductive pattern 510 through the contact hole CNT8. At the location where the second scan connection pattern 640 and the one end and the other end of the second scan conductive pattern 510 overlap each other, the second scan connection pattern 640 may be extended toward one side or the other side in the first direction DR1 to traverse the recess pattern RC, may overlap the adjacent second scan conductive pattern 510 and may be in contact with the adjacent second scan conductive pattern 510 through the contact hole CNT8.

Accordingly, among the second scan conductive patterns 510 of the pixels PX adjacent to each other in the first direction DR1, the second scan conductive patterns 510 which are separated from each other and have the recess pattern RC disposed therebetween may be electrically connected with each other via the second scan connection pattern 640.

The third scan connection pattern 650 may be extended in the first direction DR1 and may traverse the recess pattern RC extended in the second direction DR2. The third scan connection pattern 650 may overlap the third scan conductive pattern 520 in the thickness direction (the third direction DR3). The third scan connection pattern 650 may overlap one end and the other end of the third scan conductive pattern 520.

At the location where the third scan connection pattern 650 and the one end and the other end of the third scan conductive pattern 520 overlap each other, the third scan connection pattern 650 may penetrate or be disposed through the insulating layer disposed between the third scan connection pattern 650 and the third scan conductive pattern 520 and may be in contact with the third scan conductive pattern 520 through a contact hole CNT9 defined through the insulating layer to expose the third scan conductive pattern 520. In such an embodiment, the third scan connection pattern 650 may be electrically connected to the third scan conductive pattern 520 through the contact hole CNT9. At the location where the third scan connection pattern 650 and the one end and the other end of the third scan conductive pattern 520 overlap each other, the third scan connection pattern 650 may be extended toward one side or the other side in the first direction DR1 to traverse the recess pattern RC, may overlap the adjacent third scan conductive pattern 520 and may be in contact with the adjacent third scan conductive pattern 520 through the contact hole CNT9.

Accordingly, among the third scan conductive patterns 520 of the pixels PX adjacent to each other in the first direction DR1, the third scan conductive patterns 520 which are separated from each other and have the recess pattern RC disposed therebetween may be electrically connected with each other via the third scan connection pattern 650.

The emission control connection pattern 660 may be extended in the first direction DR1 and may traverse the recess pattern RC extended in the second direction DR2. The emission control connection pattern 660 may overlap the emission control conductive pattern 220 in the thickness direction (the third direction DR3). The emission control connection pattern 660 may overlap the middle part of the emission control conductive pattern 220.

At the location where the emission control connection pattern 660 and the middle part of the emission control conductive pattern 220 overlap each other, the emission control connection pattern 660 may penetrate or be disposed through the insulating layer disposed between the emission control connection pattern 660 and the emission control conductive pattern 220 and may be in contact with the emission control conductive pattern 220 through a contact hole CNT10 defined through the insulating layer to expose the emission control conductive pattern 220. In such an embodiment, the emission control connection pattern 660 may be electrically connected to the emission control conductive pattern 220 through the contact hole CNT10. At the location where the emission control connection pattern 660 and the middle part of the emission control conductive pattern 220 overlap each other, the emission control connection pattern 660 may be extended toward one side or the other side in the first direction DR1 to traverse the recess pattern RC, may overlap the adjacent emission control conductive pattern 220 and may be in contact with the adjacent emission control conductive pattern 220 through the contact hole CNT10.

Accordingly, among the emission control conductive patterns 220 of the pixels PX adjacent to each other in the first direction DR1, the emission control conductive patterns 220 which are separated from each other with the recess pattern RC disposed therebetween may be electrically connected with each other via the emission control connection pattern 660.

The first supply voltage connection pattern 670 may overlap the lower part 112 of the first vertical portion 110 of the first semiconductor layer 100. At the location where the first supply voltage connection pattern 670 and the lower part 112 of the first vertical portion 110 of the first semiconductor layer 100 overlap each other, the first supply voltage connection pattern 670 may penetrate or be disposed through the insulating layer disposed between the first supply voltage connection pattern 670 and the lower part 112 of the first vertical portion 110 of the first semiconductor layer 100 and may be in contact with the lower part 112 of the first vertical portion 110 of the first semiconductor layer 100 through a contact hole CNT11 defined through the insulating layer to expose the lower part 112 of the first vertical portion 110 of the first semiconductor layer 100. In such an embodiment, the first supply voltage connection pattern 670 may be electrically connected to the lower part 112 of the first vertical portion 110 of the first semiconductor layer 100 through the contact hole CNT11.

The first supply voltage connection pattern 670 may be extended to one side in the second direction DR2 from the location where the contact hole CNT11 is formed, and may overlap the second electrode 310 of the storage capacitor Cst. At the location where the first supply voltage connection pattern 670 and the second electrode 310 of the storage capacitor Cst overlap each other, the first supply voltage connection pattern 670 may penetrate or be disposed through the insulating layer disposed between the first supply voltage connection pattern 670 and the second electrode 310 of the storage capacitor Cst and may be in contact with the second electrode 310 of the storage capacitor Cst through a contact hole CNT12 defined through the insulating layer to expose the second electrode 310 of the storage capacitor Cst. In such an embodiment, the first supply voltage connection pattern 670 may be electrically connected to the second electrode 310 of the storage capacitor Cst through the contact hole CNT11.

The first supply voltage connection pattern 670 connects the lower part 112 of the first vertical portion 110 of the first semiconductor layer 100 and the second electrode 310 of the storage capacitor Cst with the first supply voltage line 710. In such an embodiment, the first supply voltage line 710 may be electrically connected to the lower part 112 of the first vertical portion 110 of the first semiconductor layer 100 and the second electrode 310 of the storage capacitor Cst through the first supply voltage connection pattern 670.

The first supply voltage connection pattern 670 may be extended to one side or the other side in the first direction DR1 across the recess pattern RC, and may be connected to the first supply voltage connection pattern 670 of an adjacent pixel. It should be understood, however, that the disclosure is not limited thereto.

The data connection pattern 680 may overlap the upper part 111 of the first vertical portion 110 of the first semiconductor layer 100. At the location where the data connection pattern 680 and the upper part 111 of the first vertical portion 110 of the first semiconductor layer 100 overlap each other, the data connection pattern 680 may penetrate or be disposed through the insulating layer disposed between the data connection pattern 680 and the upper part 111 of the first vertical portion 110 of the first semiconductor layer 100 and may be in contact with the upper part 111 of the first vertical portion 110 of the first semiconductor layer 100 through a contact hole CNT13 defined through the insulating layer to expose the upper part 111 of the first vertical portion 110 of the first semiconductor layer 100. In such an embodiment, the data connection pattern 680 may be electrically connected to the upper part 111 of the first vertical portion 110 of the first semiconductor layer 100 through the contact hole CNT13.

The data connection pattern 680 may electrically connect the upper part 111 of the first vertical portion 110 of the first semiconductor layer 100 with the data line 720. In other words, the data connection pattern 680 may be electrically connected to the upper part 111 of the first vertical portion 110 of the first semiconductor layer 100 through the data connection pattern 680.

The data connection pattern 680 may be extended to one side or the other side in the first direction DR1 across the recess pattern RC, and may be connected to the data connection pattern 680 of an adjacent pixel. It should be understood, however, that the disclosure is not limited thereto.

The first anode connection pattern 690 may overlap the second vertical portion 120 of the first semiconductor layer 100. At the location where the first anode connection pattern 690 and the second vertical portion 120 of the first semiconductor layer 100 overlap each other, the first anode connection pattern 690 may penetrate or be disposed through the insulating layer disposed between the first anode connection pattern 690 and the second vertical portion 120 of the first semiconductor layer 100 and may be in contact with the second vertical portion 120 of the first semiconductor layer 100 through a contact hole CNT14 defined through the insulating layer to expose the second vertical portion 120 of the first semiconductor layer 100. In such an embodiment, the first anode connection pattern 690 may be electrically connected to the second vertical portion 120 of the first semiconductor layer 100 through the contact hole CNT14.

The first anode connection pattern 690 may electrically connect the second vertical portion 120 of the first semiconductor layer 100 with the anode electrode ANO together with the second anode connection pattern 730. In such an embodiment, the anode electrode ANO may be electrically connected to the second vertical portion 120 of the first semiconductor layer 100 via the first anode connection pattern 690 and the second anode connection pattern 730. The first anode connection pattern 690 may be disposed separately in each of the pixels PX and may be disposed on the lower side of a pixel when viewed from the top. It should be understood, however, that the disclosure is not limited thereto.

The fourth conductive layer 600 may include at least one metal selected from: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The fourth conductive layer 600 may be made up of a single layer or multiple layers or have a single layer structure or a multilayer structure. In an embodiment, for example, the fourth conductive layer 600 may have a stack structure of Ti/Al/Ti, Mo/Al/Mo, Mo/AlGe/Mo, Ti/Cu, etc.

Figure 11:
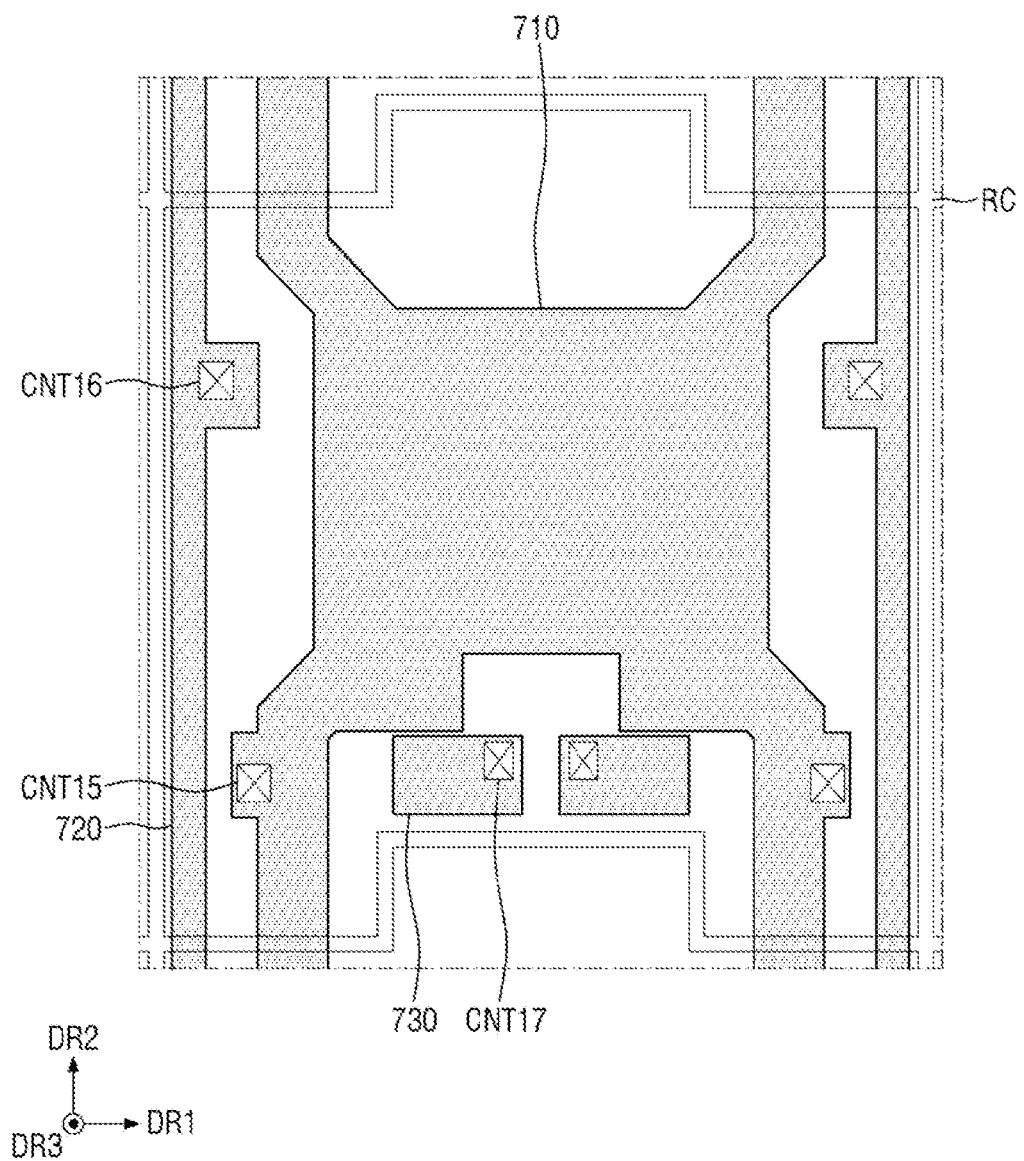
FIG. 11 is a plan view of the fifth conductive layer of FIG. 5.

FIG. 11 is a plan view of the fifth conductive layer of FIG. 5.

Referring to FIGS. 5 and 11, the fifth conductive layer 700 may include a first supply voltage line 710 for applying the first supply voltage ELVDD (see FIG. 3), a data line 720 for transmitting the data signal DATA (see FIG. 3), and a second anode connection pattern 730 electrically connecting the anode electrode ANO with the first anode connection pattern 690.

The first supply voltage line 710 and the data line 720 may be extended in the second direction DR2. The first supply voltage line 710 and the data line 720 may be extended to neighboring pixels beyond the boundary of the pixels along the second direction DR2. In the area surrounded by the recess pattern RC, the first supply voltage line 710 may be located near the center, while the data lines 720 may be adjacent to the left and right sides. In the area surrounded by the recess pattern RC, the supply voltage line 710 may be disposed between the data lines 720, but the disclosure is not limited thereto. The second anode connection pattern 730 may be disposed separately in each of the pixels PX and may be disposed on the lower side of a pixel when viewed from the top. It should be understood, however, that the disclosure is not limited thereto.

The first supply voltage line 710 may overlap the first supply voltage connection pattern 670. At the location where the first supply voltage line 710 and the first supply voltage connection pattern 670 overlap each other, the first supply voltage line 710 may penetrate or be disposed through the insulating layer disposed between the first supply voltage line 710 and the first supply voltage connection pattern 670 and may be in contact with the first supply voltage connection pattern 670 through a contact hole CNT15 defined through the insulating layer to expose the first supply voltage connection pattern 670. In other words, the first supply voltage line 710 may be electrically connected to the first supply voltage connection pattern 670 through the contact hole CNT15.

The data line 720 may overlap the data connection pattern 680. At the location where the data line 720 and the data connection pattern 680 overlap each other, the data line 720 may penetrate or be disposed through the insulating layer disposed between the data line 720 and the data connection pattern 680 and may be in contact with the data connection pattern 680 through a contact hole CNT16 defined through the insulating layer to expose the data connection pattern 680. In such an embodiment, the data line 720 may be electrically connected to the data connection pattern 680 through the contact hole CNT16.

The second anode connection pattern 730 may overlap the first anode connection pattern 690. At the location where the second anode connection pattern 730 and the first anode connection pattern 690 overlap each other, the second anode connection pattern 730 may penetrate or be disposed through the insulating layer disposed between the second anode connection pattern 730 and the first anode connection pattern 690 and may be in contact with the first anode connection pattern 690 through a contact hole CNT17 defined through the insulating layer to expose the first anode connection pattern 690. In such an embodiment, the second anode connection pattern 730 may be electrically connected to the first anode connection pattern 690 through the contact hole CNT17.

The fifth conductive layer 700 may include a same material or may have a same stack structure as the fourth conductive layer 600, but the disclosure is not limited thereto. In an embodiment, for example, the fifth conductive layer 700 may include at least one selected from the above-described materials with reference to the fourth conductive layer 600 may include.

Hereinafter, a cross-sectional structure of the second pixel PX2 will be described with reference to FIG. 12.

Figure 12:
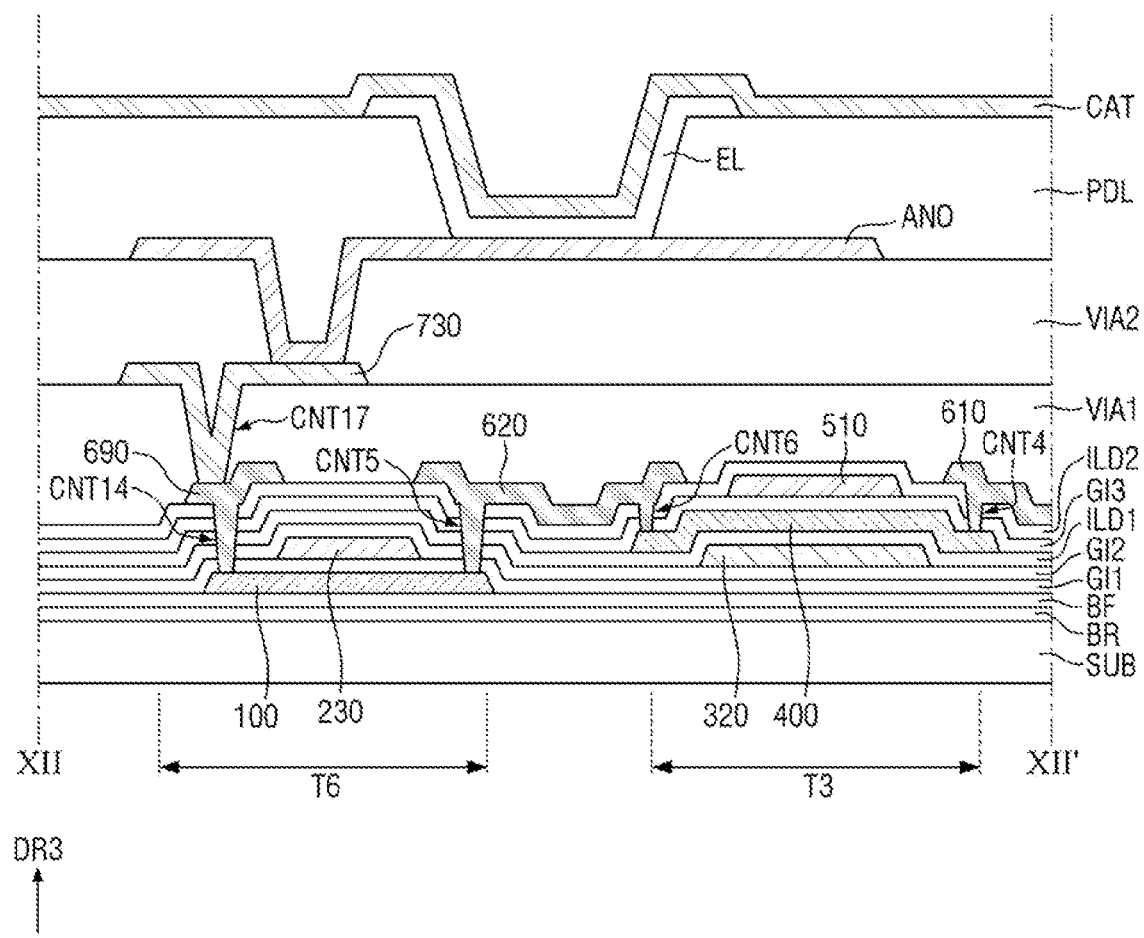
FIG. 12 is a cross-sectional view taken along line XII-XII' of FIG. 5.

FIG. 12 is a cross-sectional view taken along line XII-XII' of FIG. 5.

Referring to FIGS. 5 and 12, an embodiment of the display device 1 may further include a substrate SUB, a plurality of insulating films, an anode electrode ANO, an emission layer EL, and a cathode electrode CAT. As the layers of the pixels PX, a substrate SUB, a barrier layer BR, a buffer layer BF, a first semiconductor layer 100, a first gate insulating film GI1 (or first insulating film), a first conductive layer 200, a second gate insulating film GI2 (or a second insulating film), a second conductive layer 300, a first interlayer dielectric film ILD1 (or third insulating film), a second semiconductor layer 400, a third gate insulating film GI3 (or a fourth insulating film), a third conductive layer 500, a second interlayer dielectric film ILD2 (or a fifth insulating film), a fourth conductive layer 600, a first via layer VIA1, a fifth conductive layer 700, a second via layer VIA2, an anode electrode ANO, a pixel-defining layer PDL, an emissive layer EL, and a cathode electrode CAT may be sequentially disposed on one another. Each of the layers described above may be made up of a single film, or a stack of multiple films or have a single layer structure or a multilayer structure. Other layers may be further disposed between the layers.

In the following description, the first semiconductor layer 100, the second semiconductor layer 400 and the first to fifth conductive layers 200, 300, 500, 600 and 700 will not be described in detail.

The substrate SUB supports the layers disposed thereon. A transparent substrate may be used when the organic light-emitting display device is of a bottom-emission or double-sided emission type. In an embodiment where the organic light-emitting display device is of a top-emission type, a semitransparent or opaque substrate as well as a transparent substrate may be employed.

In an embodiment, the substrate SUB may include or be made of an insulating material such as glass, quartz and a polymer resin. In such an embodiment, the polymer material may include polyethersulphone ("PES"), polyacrylate ("PA"), polyacrylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP") or a combination thereof, for example. The substrate SUB may include a metal material.

The substrate SUB may be a rigid substrate or a flexible substrate that can be bent, folded, rolled, and so on. In an embodiment, the material of the flexible substrate may be, but is not limited to, polyimide ("PI").

The barrier layer BR may be disposed on the substrate SUB. The barrier layer BR can prevent impurity ions from diffusing, may prevent permeation of moisture or outside air, and may provide a flat surface. The barrier layer BR may include silicon nitride, silicon oxide, silicon oxynitride, or the like. The barrier layer BR may be omitted depending on the type of the substrate SUB, process conditions, etc.

The buffer layer BF may be disposed on the barrier layer BR. The buffer layer BF may provide a flat surface over the substrate SUB and may enhance adhesion to the elements disposed on the buffer layer BF. The buffer layer BF may include or be made of a material including at least one selected from silicon nitride, silicon oxide and silicon oxynitride. The buffer layer BF may be omitted depending on the type of the substrate SUB, process conditions, etc. The first semiconductor layer 100 may be disposed on the buffer layer BF.

The first gate insulating film GI1 may be disposed on the first semiconductor layer 100 and may be disposed generally throughout the entire surface of the substrate SUB. The first gate insulating film GI1 may be a gate insulating film having a gate insulating function.

The first gate insulating film GI1 may include a silicon compound, a metal oxide, etc. In an embodiment, for example, the first gate insulating film GI1 may include at least one selected from silicon oxide, silicon nitride, silicon oxynitride, aluminum oxide, tantalum oxide, hafnium oxide, zirconium oxide, titanium oxide and a combination thereof. The first conductive layer 200 may be disposed on the first gate insulating film GI1.

The second gate insulating film GI2 may be disposed on the first conductive layer 200 and may be disposed throughout the entire surface of the substrate SUB. The second gate insulating film GI2 serves to insulate the first conductive layer 200 from the second conductive layer 300. The second gate insulating film GI2 may be an interlayer dielectric film. The second gate insulating film GI2 may include, but is not limited to, substantially the same material as the first gate insulating film GI1. The second conductive layer 300 may be disposed on the second gate insulating film GI2.

The first interlayer dielectric film ILD1 may cover the second conductive layer 300 and may be disposed on the second conductive layer 300. The first interlayer dielectric film IL1 may be disposed generally throughout the entire surface of the substrate SUB. The first interlayer dielectric film ILD1 may insulate the second conductive layer 300 from the second semiconductor layer 400. The first interlayer dielectric film ILD1 may be an interlayer dielectric film. The first interlayer dielectric film ILD1 may be disposed on the second semiconductor layer 400.

The first interlayer dielectric film ILD1 may include a silicon compound, a metal oxide, etc. In an embodiment, for example, the first interlayer dielectric film ILD1 may include at least one selected from silicon oxide, silicon nitride, silicon oxynitride, aluminum oxide, tantalum oxide, hafnium oxide, zirconium oxide, titanium oxide and a combination thereof.

The third gate insulating film GI3 is disposed on the second semiconductor layer 400. The third gate insulating film GI3 may be disposed on the second semiconductor layer 400 and may be disposed generally throughout the entire surface of the substrate SUB. The third gate insulating film GI3 may be a gate insulating film having a gate insulating function. The third gate insulating film GI3 may include, but is not limited to, substantially a same material as the first gate insulating film GI1. The third conductive layer 500 is disposed on the third gate insulating film GI3.

The second interlayer dielectric film ILD2 may cover the third conductive layer 500 and may be disposed on the third conductive layer 500. The second interlayer dielectric film IL2 may be disposed generally throughout the entire surface of the substrate SUB. The second interlayer dielectric film IL2 may insulate the third conductive layer 500 from the fourth conductive layer 600. The second interlayer dielectric film ILD2 may be an interlayer dielectric film. The second interlayer dielectric film ILD2 may include, but is not limited to, substantially the same material as the first interlayer dielectric film ILD1. The fourth conductive layer 600 may be disposed on the second interlayer dielectric film ILD2.

The first via layer VIA1 is disposed on the fourth conductive layer 600. The first via layer VIA1 may include an inorganic insulating material or an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene ("BCB"). In an embodiment where the first via layer VIA1 includes an organic insulating material, the upper surface of the first via layer VIA1 may be generally flat despite level difference thereunder. The fifth conductive layer 700 may be disposed on the first via layer VIA1.

The second via layer VIA2 is disposed on the fifth conductive layer 700. The second via layer VIA2 may include substantially a same material as the first via layer VIA1. In an embodiment where the second via layer VIA2 includes an organic insulating material, the upper surface of the second via layer VIA2 may be generally flat despite level difference thereunder.

The anode electrode ANO is disposed on the second via layer VIA2. The anode electrode ANO may be an anode electrode. The anode electrode ANO may be disposed separately in each of the pixels. The anode electrode ANO may penetrate or be disposed through the second via layer VIA2 and may be electrically connected to the second anode connection pattern 730 through a contact hole defined through the second via layer VIA2 to expose a part of the second anode connection pattern 730.

The anode electrode ANO may have, but is not limited to, a stack structure of a material layer having a high work function such as indium-tin-oxide ("ITO"), indium-zinc-oxide ("IZO"), zinc oxide (ZnO) and indium oxide (In$_2$O$_3$), and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or a mixture thereof. A layer having a higher work function may be disposed above a reflective material layer so that the layer is disposed closer to the emissive layer EL. The anode electrode ANO may have, but is not limited to, a multilayer structure of ITO/Mg, ITO/MgF, ITO/Ag, and ITO/Ag/ITO.

The pixel-defining layer PDL may be disposed on the anode electrode ANO. In an embodiment, an opening exposing a part of the anode electrode ANO may be defined through the pixel-defining layer PDL. The pixel-defining layer PDL may include an organic insulating material or an inorganic insulating material. In an embodiment, for example, the pixel-defining layer PDL may include at least one selected from: a polyimide resin, an acrylic resin, a silicon compound, a polyacrylic resin, and the like.

The emissive layer EL may be disposed on the anode electrode ANO exposed by the pixel-defining layer PDL. The emissive layer EL may include an organic material layer. The organic material layer of the emission layer may include an organic emission layer and may further include a hole injecting/transporting layer and/or an electron injecting/transporting layer.

The cathode electrode CAT may be disposed on the emissive layer EL. The cathode electrode CAT may be a common electrode disposed across the pixels. The anode electrode ANO, the emissive layer EL and the cathode electrode CAT may form or define an organic light-emitting element.

The cathode electrode CAT may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode CAT may further include a transparent metal oxide layer disposed on the material layer having a small work function.

Although not shown in the drawings, a thin-film encapsulation layer including at least one inorganic film and at least one organic film may be disposed on the cathode electrode CAT. The thin-film encapsulation layer may encapsulate the elements of the pixels and prevent permeation of outside air, moisture, etc.

Hereinafter, a cross-sectional structure of a recess pattern RC will be described with reference to FIG. 13.

Figure 13:
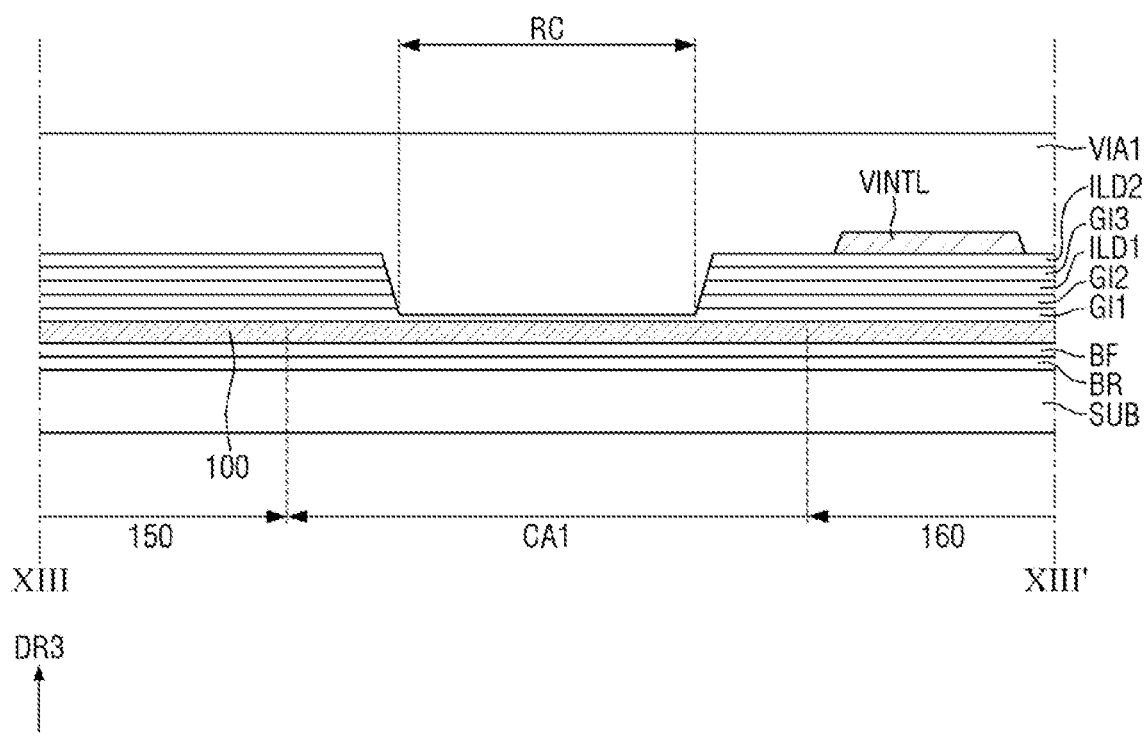
FIG. 13 is a cross-sectional view taken along line XIII-XIII' of FIG. 5.

FIG. 13 is a cross-sectional view taken along line XIII-XIII' of FIG. 5. Although FIG. 13 shows a cross section around the first semiconductor connection pattern CA1 connecting the third vertical portion 150 with the fourth vertical portion 160, the description thereon may be equally applied to a cross section around the second semiconductor connection pattern CA2.

Referring to FIGS. 5 and 13, in an embodiment, the recess pattern RC may intersect a part of the first semiconductor connection pattern CA1 and may overlap the part of the first semiconductor connection pattern CA1. The recess pattern RC may include a shape depressed toward the substrate SUB from one surface (upper surface) of the second interlayer dielectric film ILD2. In such an embodiment, the recess pattern RC may be defined by the second interlayer dielectric film ILD2, the third gate insulating film GI3, the first interlayer dielectric film ILD1, the second gate insulating film GI2, and the first gate insulating film GI1. It should be understood, however, that the disclosure is not limited thereto. Alternatively, the recess pattern RC may be defined by at least some of the second interlayer dielectric film ILD2, the third gate insulating film GI3, the first interlayer dielectric film ILD1, the second gate insulating film GI2, and the first gate insulating film GI1.

Each of the second interlayer dielectric film ILD2, the third gate insulating film GI3, the first interlayer dielectric film ILD1 and the second gate insulating film GI2 defines a through hole passing therethrough in the thickness direction (the third direction DR3). The first gate insulating film GI1 may define a groove recessed from the surface (upper surface) toward the other surface (lower surface). In such an embodiment, the recess pattern RC may be defined by the through hole of each of the second interlayer dielectric film ILD2, the third gate insulating film GI3, the first interlayer dielectric film ILD1 and the second gate insulating film GI2, and by the groove of the first gate insulating film GI1. Alternatively, the recess pattern RC may be defined by the side surfaces of each of the second interlayer dielectric film ILD2, the third gate insulating film GI3, the first interlayer dielectric film ILD1 and the second gate insulating film GI2 defining the respective through holes, and by the side surfaces and upper surface of the first gate insulating film GI1 defining the groove. The through holes and the groove may overlap one another in the thickness direction (third direction DR3).

Hereinafter, alternative embodiments of the disclosure will be described. In the following description, the same or similar elements will be denoted by the same or similar reference numerals, and any repetitive detailed descriptions will be omitted or simplified. Descriptions will be made focusing on differences from the embodiments described above.

Figure 14:
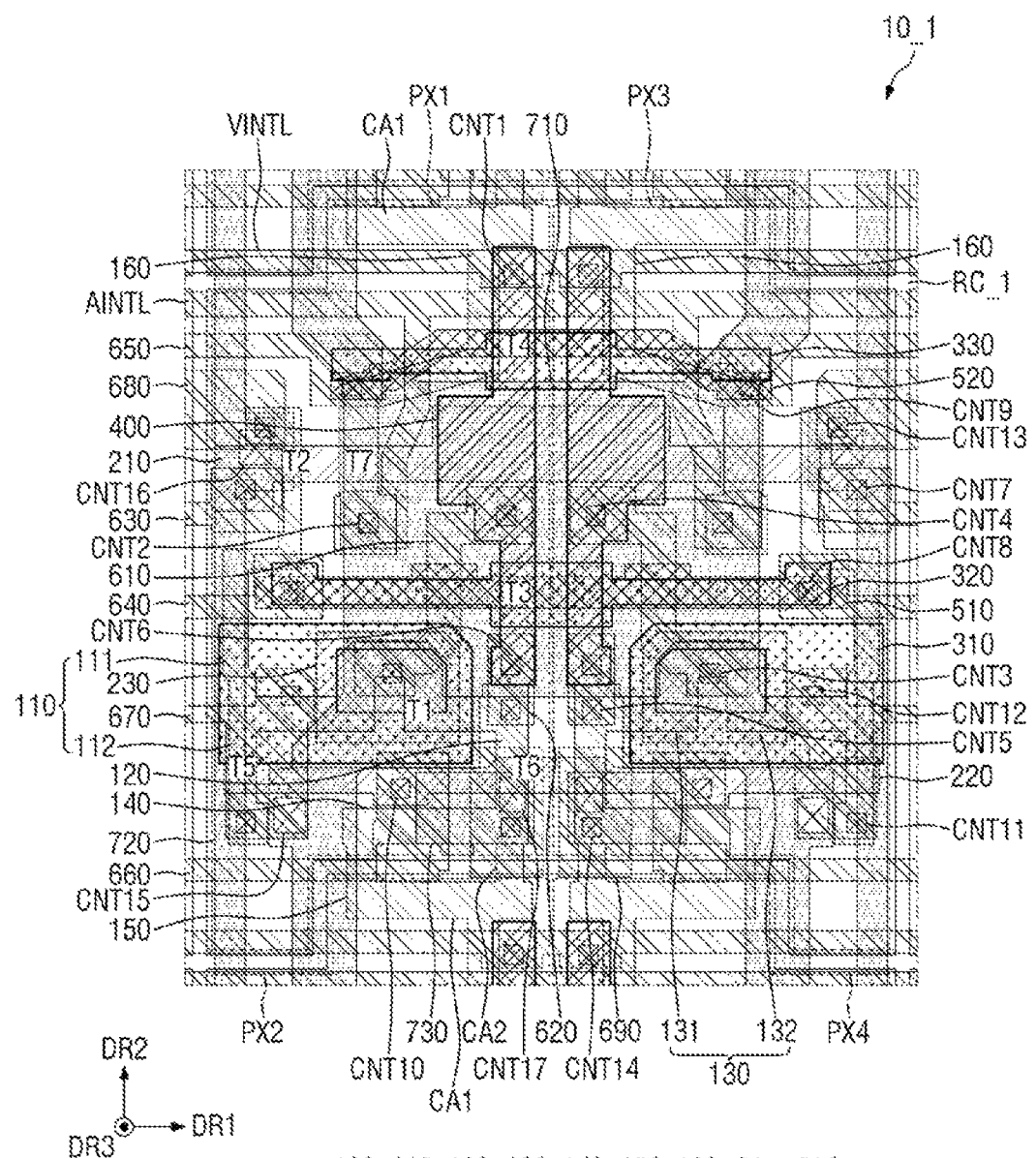
FIG. 14 is a plan view of a pixel according to an alternative embodiment.

FIG. 14 is a plan view of a pixel according to an alternative embodiment.

The embodiment of FIG. 14 is substantially the same as the embodiment of FIG. 5 except that parts of a first semiconductor layer 100 of a display panel 10_1 which are extended in a same direction when viewed from the top intersects a recessed pattern RC_1 between the pixels PX adjacent to each other in the second direction DR2. Between the pixels PX adjacent to each other in the second direction DR2, the recess pattern RC_1 may intersect a second semiconductor connection pattern CA2 and a third vertical portion 150. The second semiconductor connection pattern CA2 and the third vertical portion 150 may be extended in the second direction DR2 and may intersect the recess pattern RC_1 extended in the first direction DR1.

In such an embodiment, damage to each pixel PX due to an external impact may be substantially suppressed or effectively prevented, and the resolution may be improved. In such an embodiment, the direction in which the first semiconductor layer 100 traverses the recess pattern RC_1 may be designed in a variety of ways to reduce shock transmission due to external impact, and thus various designs for improving the reliability of the display device is possible.

Figure 15:
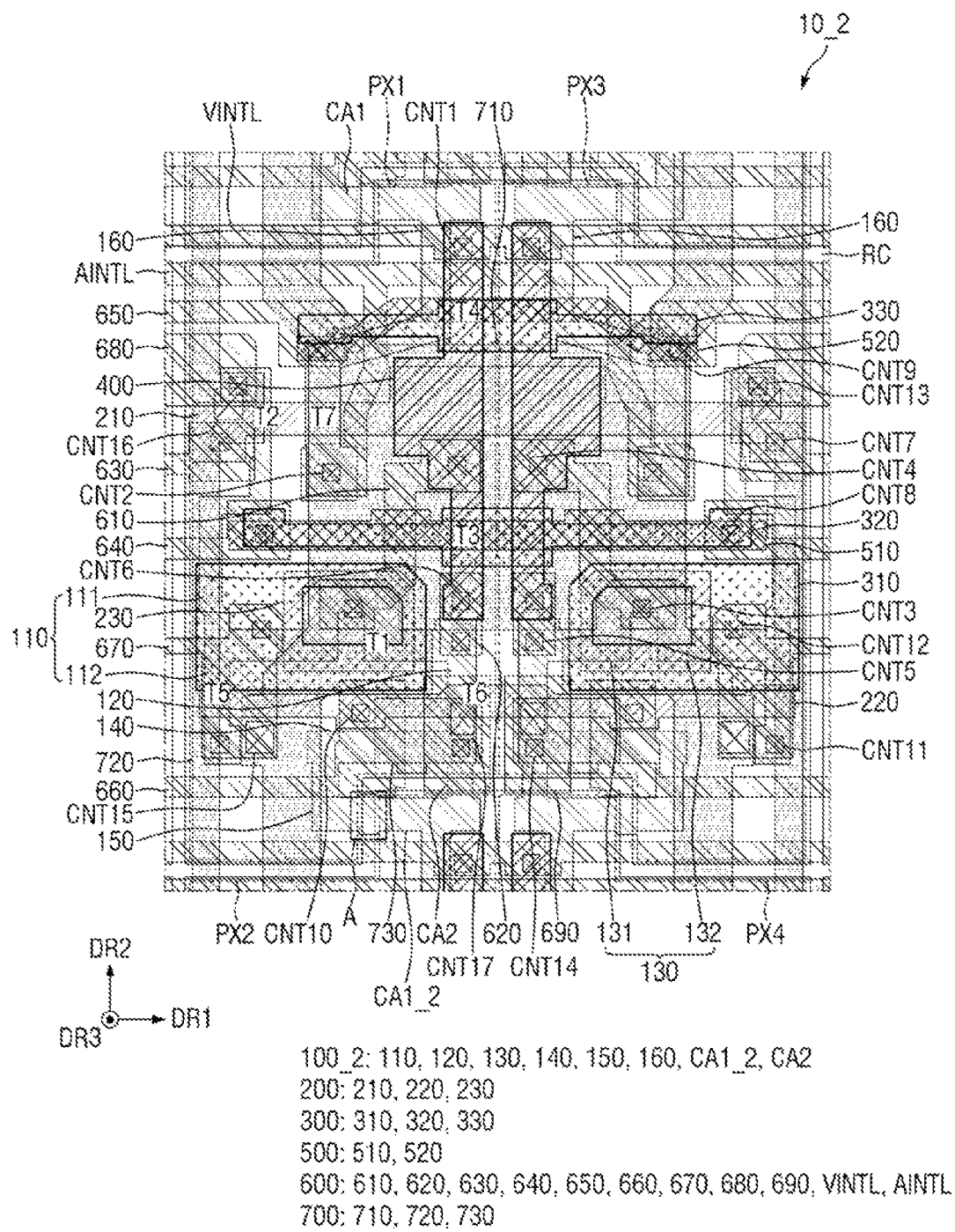
FIG. 15 is a plan view of a pixel according to another alternative embodiment.
Figure 16:
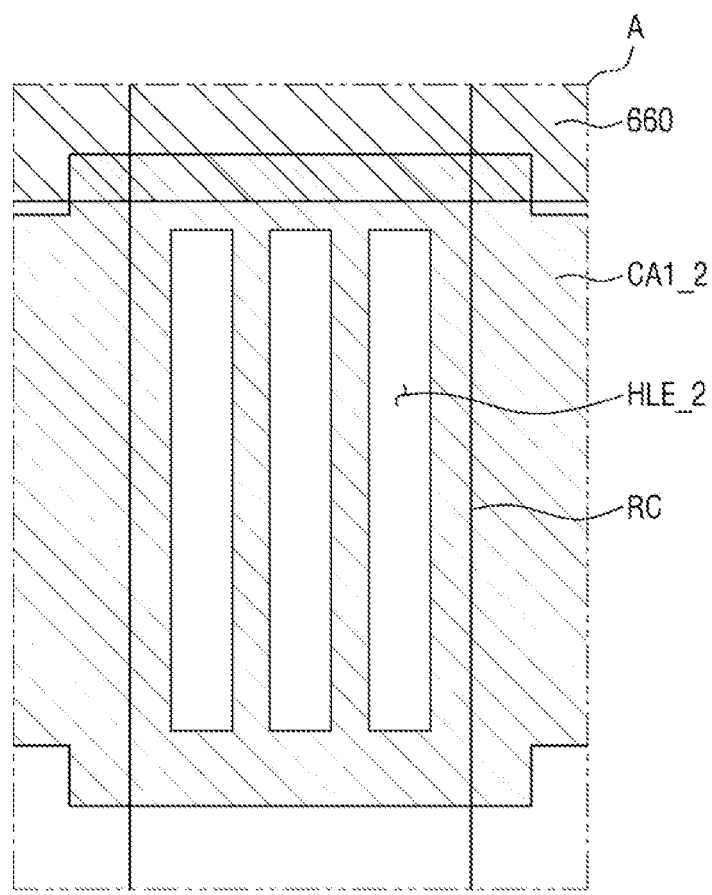
FIG. 16 is an enlarged view of area A of FIG. 15.

FIG. 15 is a plan view of a pixel according to another alternative embodiment. FIG. 16 is an enlarged view of area A of FIG. 15.

The embodiment of FIGS. 15 and 16 is substantially the same as the embodiment of FIG. 5 except that a through hole HLE_2 is defined through a first semiconductor pattern 100_2 of a display panel 10_2 in the thickness direction at an intersection with a recess pattern RC.

A part of the first semiconductor connection pattern CA1_2 that overlaps the recessed pattern RC may have a larger width than the other parts and may include at least one through hole HLE_2 where it overlaps the recess pattern RC. Although three through holes HLE_2 are formed at the location where the first semiconductor connection pattern CA1_2 and the recess pattern RC overlap each other in an embodiment shown in FIG. 16, the disclosure is not limited thereto. Although not shown in the drawings, a through hole may be defined through the second semiconductor connection pattern CA2 at a location thereof intersecting the recess pattern RC.

In such an embodiment, damage to each pixel PX due to an external impact may be substantially suppressed or effectively prevented, and the resolution may be improved. In such an embodiment, as the through hole HLE_2 is defined through the first semiconductor connection pattern CA1_2 at the location thereof overlapping the recess pattern RC, the first semiconductor connection pattern CA1_2 may substantially suppress or effectively prevent cracks due to external impact. Since there are a variety of paths through which electric current can flow at the location where the first semiconductor connection pattern CA1_2 intersects the recess pattern RC, a defect such as electrical disconnection may be substantially suppressed or effectively prevented even if a crack occurs.

Figure 17:
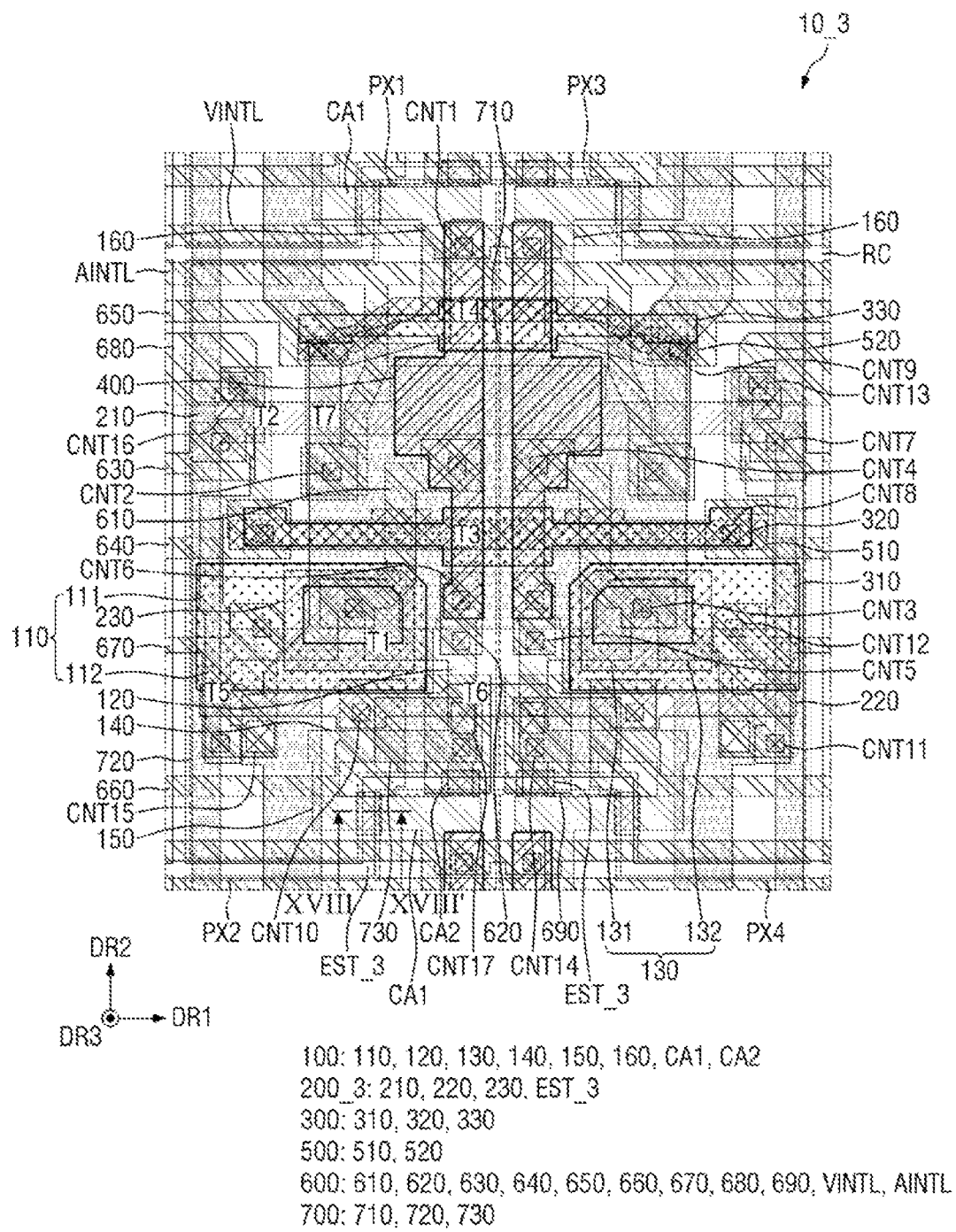
FIG. 17 is a plan view of a pixel according to yet another alternative embodiment.
Figure 18:
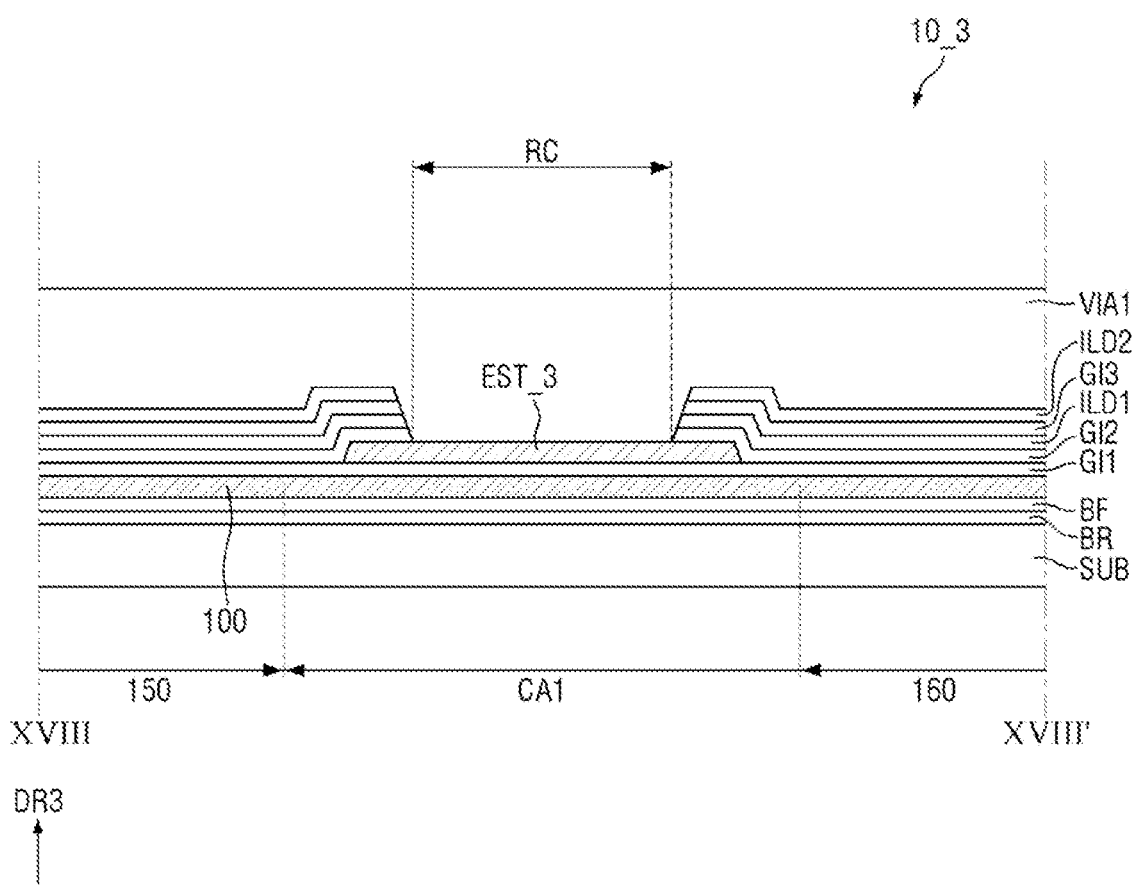
FIG. 18 is a cross-sectional view taken along line XVIII-XVIII' of FIG. 17.

FIG. 17 is a plan view of a pixel according to yet another alternative embodiment. FIG. 18 is a cross-sectional view taken along line XVIII-XVIII' of FIG. 17.

The embodiment of FIGS. 17 and 18 is substantially the same as the embodiment of FIG. 5 except that a display panel 10_3 further includes an etch stop pattern EST_3 at an intersection of the first semiconductor layer 100 and the recess pattern RC.

In such an embodiment, the etch stop pattern EST_3 may be disposed on the first gate insulating film GI1 and may be formed of or defined by the first conductive layer 200, but the disclosure is not limited thereto. In an embodiment, for example, the etch stop pattern EST_3 may be formed of or defined by at least one selected from the first to third conductive layers 200, 300 and 500 and the second semiconductor layer 400. The etch stop pattern EST_3 may be exposed by the recess pattern RC. The recess pattern RC may be filled with the first via layer VIA1, and in such an embodiment, the etch stop pattern EST_3 may be in direct contact with the via layer VIA'.

The etch stop pattern EST_3 may be a dummy pattern. In such an embodiment, the etch stop pattern EST_3 may be separated from other conductive patterns of the first to third conductive layers 200, 300 and 500 (see FIG. 5) and from the second semiconductor layer 400 (see FIG. 5), and may be electrically insulated therefrom. The etch stop pattern EST_3 may include, but is not limited to, an island shape.

In such an embodiment, damage to each pixel PX due to an external impact may be substantially suppressed or effectively prevented, and the resolution may be improved. In such an embodiment, by disposing the etch stop pattern EST_3, etching of the first semiconductor layer 100 in the process of forming the recess pattern RC may be substantially suppressed or effectively prevented, so that the reliability of the display panel 10_3 may be improved.

Figure 19:
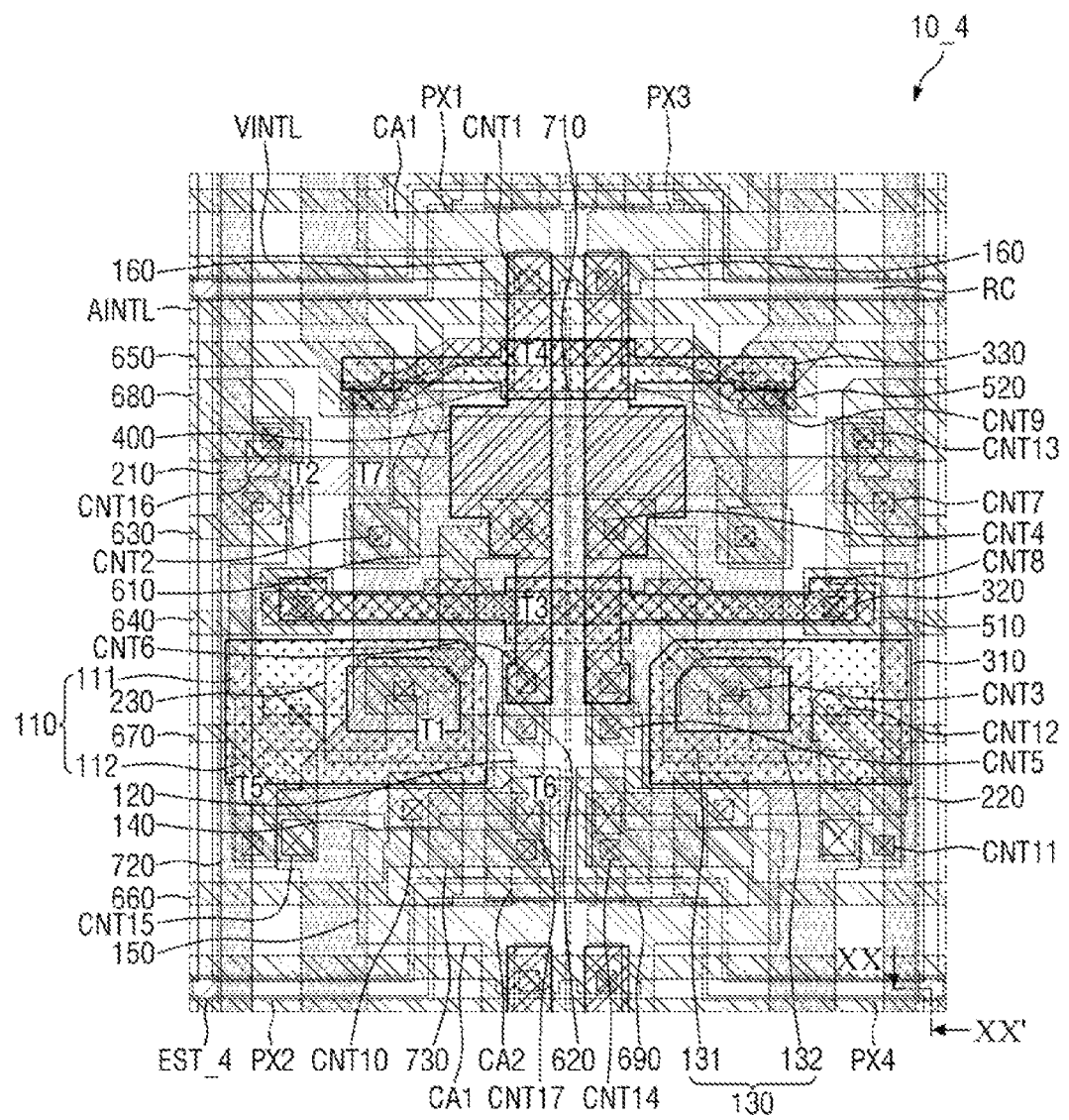
FIG. 19 is a plan view of a pixel according to yet another alternative embodiment.
Figure 20:
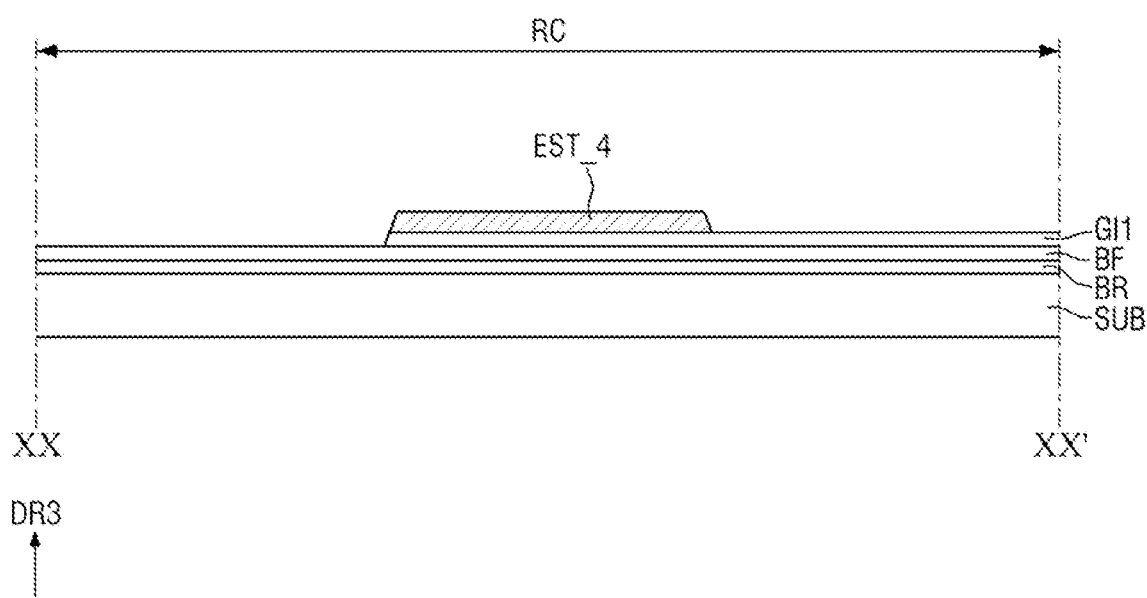
FIG. 20 is a cross-sectional view taken along line XX-XX' of FIG. 19.

FIG. 19 is a plan view of a pixel according to yet another alternative embodiment. FIG. 20 is a cross-sectional view taken along line XX-XX' of FIG. 19.

The embodiment of FIGS. 19 and 20 is substantially the same as the embodiment of FIG. 5 except that an etch stop pattern EST_4 is disposed in at an intersection of parts of a recess pattern RC extended in different directions.

In such an embodiment, the etch stop pattern EST_4 may be disposed at the intersection of a part of the recess pattern RC extended in the first direction DR1 and a part of the recess pattern RC extended in the second direction DR2. By disposing the etch stop pattern EST_4, the intersection is effectively prevented from being etched twice. The part of the recess pattern RC extended in the first direction DR1 and the part of the recess pattern RC extended in the second direction DR2 may be etched via different processes. In such an etching process, the intersection of the part of the recess pattern RC extended in the first direction DR1 and the part of the recess pattern RC extended in the second direction DR2 may be etched twice. In an embodiment, for example, the part of the recess pattern RC extended in the first direction DR1 may be formed in the process of forming the contact holes CNT5 and CNT14 exposing the first semiconductor layer 100 (see FIG. 12), and the part of the recess pattern RC extended in the second direction DR2 may be formed in the process of forming the contact holes CNT4 and CNT6 exposing the second semiconductor layer 400 (see FIG. 12).

In such an embodiment, by disposing the etch stop pattern EST_4 at the intersection of the part of the recess pattern RC extended in the first direction DR1 and the part of the recess pattern RC extended in the second direction DR2, the intersection is effectively prevented from being etched twice, and thus the reliability of the display panel 10_4 may be improved. The etch stop pattern EST_4 may be disposed on the first gate insulating film GI1 and may be formed of or defined by the first conductive layer 200, but the disclosure is not limited thereto.

In such an embodiment, damage to each pixel PX due to an external impact may be substantially suppressed or effectively prevented, and the resolution may be improved.

Figure 21:
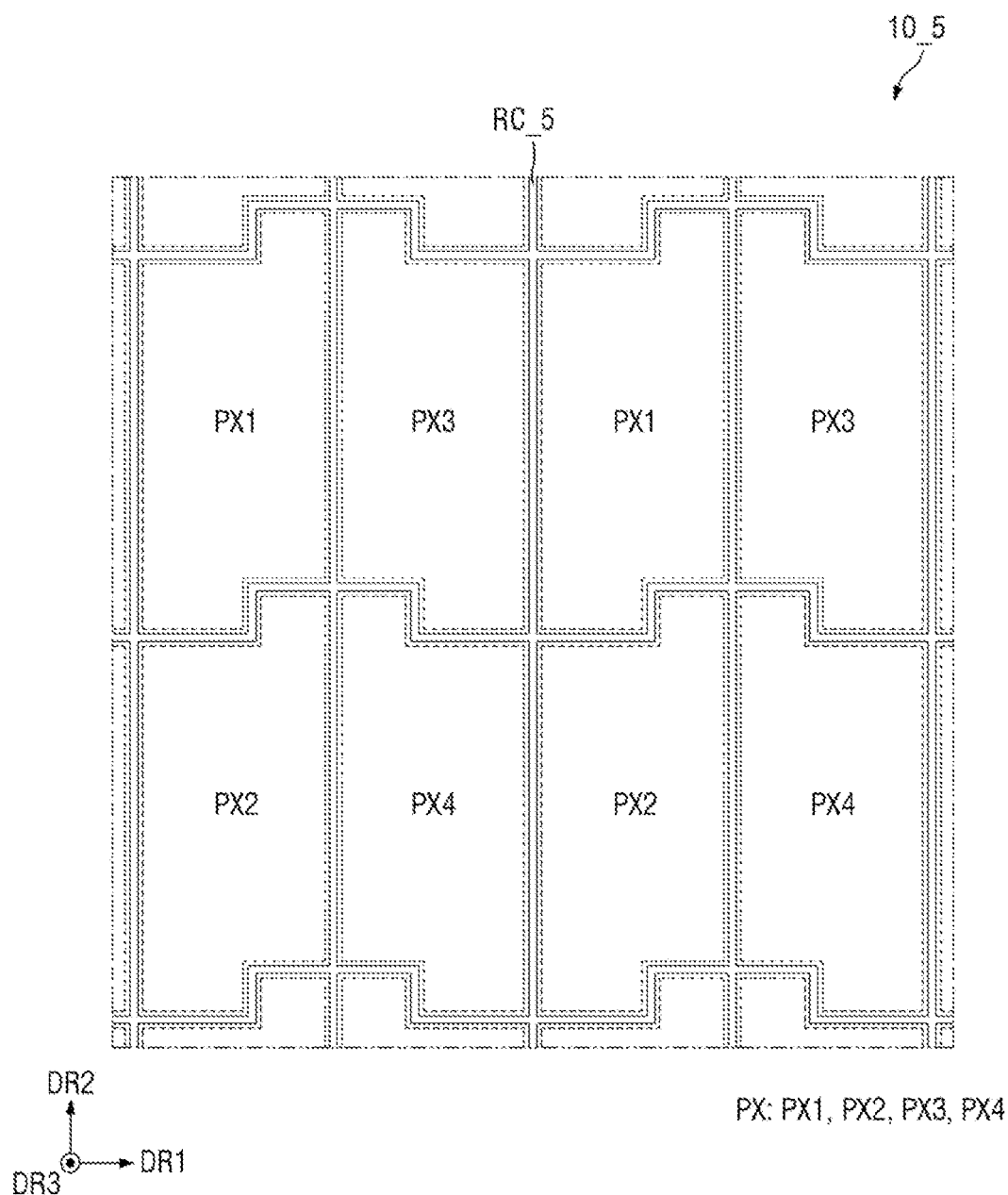
FIG. 21 is a plan view showing a layout of a plurality of pixels according to another alternative embodiment.

FIG. 21 is a plan view showing a layout of a plurality of pixels according to another alternative embodiment.

The embodiment of FIG. 21 is substantially the same as the embodiment of FIG. 4 except that a recess pattern RC_5 of a display device surrounds each of first to fourth pixels PX1, PX2, PX3 and PX4. In such an embodiment, the recess pattern RC_5 of the display panel 10_5 may be further disposed between the first pixel PX1 and the third pixel PX3 to be extended in the second direction DR2, and between the second pixel PX2 and the fourth pixel PX4 to be extended in the first direction DR1.

Accordingly, each of the first to fourth pixels PX1, PX2, PX3 and PX4 may be disposed in an area surrounded by the recess pattern RC_5, and the recess pattern RC_5 may be disposed between every two of the first to fourth pixels PX1, PX2, PX3 and PX4.

In such an embodiment, since each of the pixels PX1, PX2, PX3 and PX4 is surrounded by the recess pattern RC_5, damage to each of the pixels PX1, PX2, PX3 and PX4 caused by an external impact may be substantially suppressed or effectively prevented.

Figure 22:
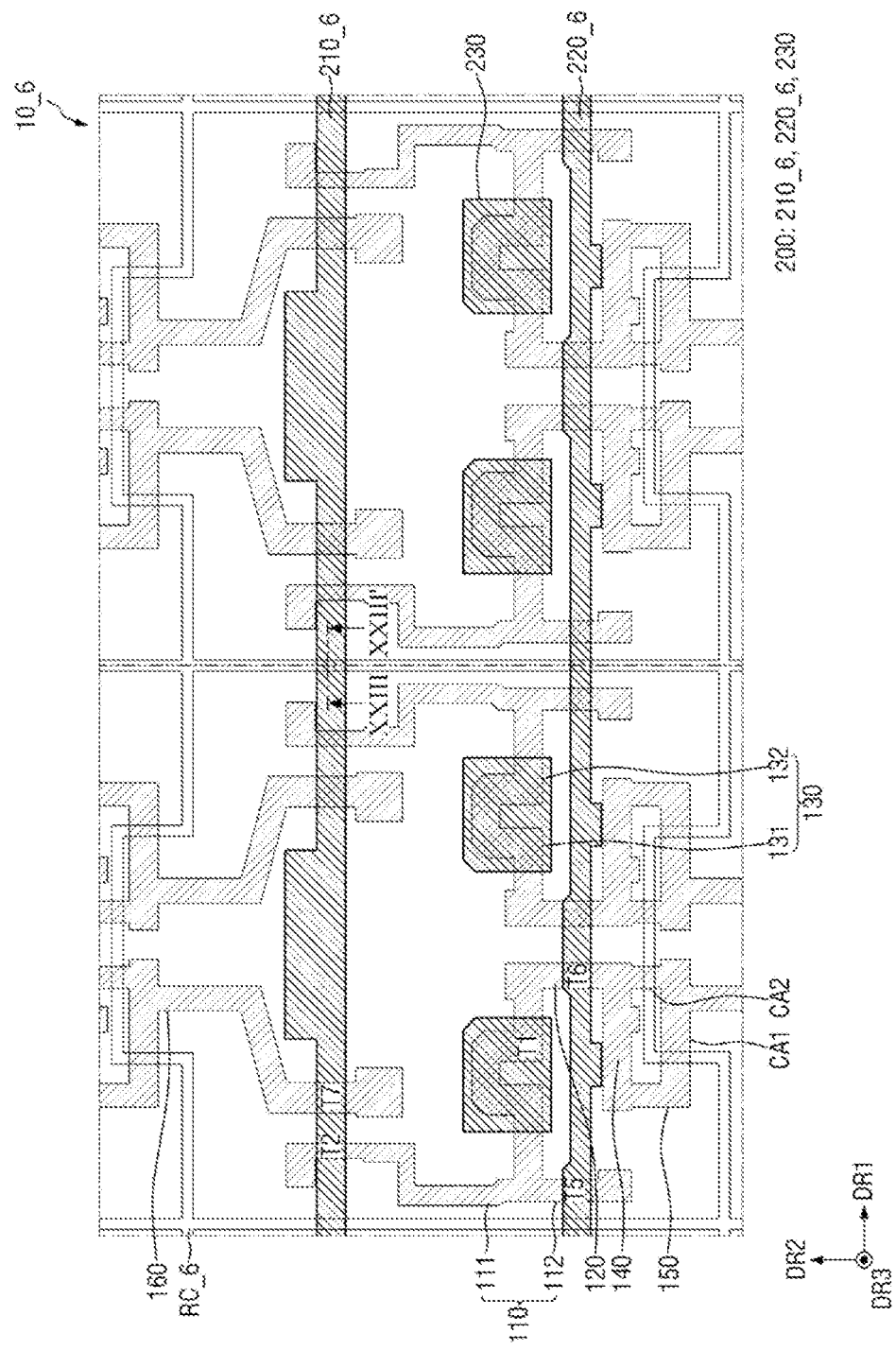
FIG. 22 is a plan view of a first semiconductor layer and a first conductive layer according to yet another alternative embodiment.
Figure 23:
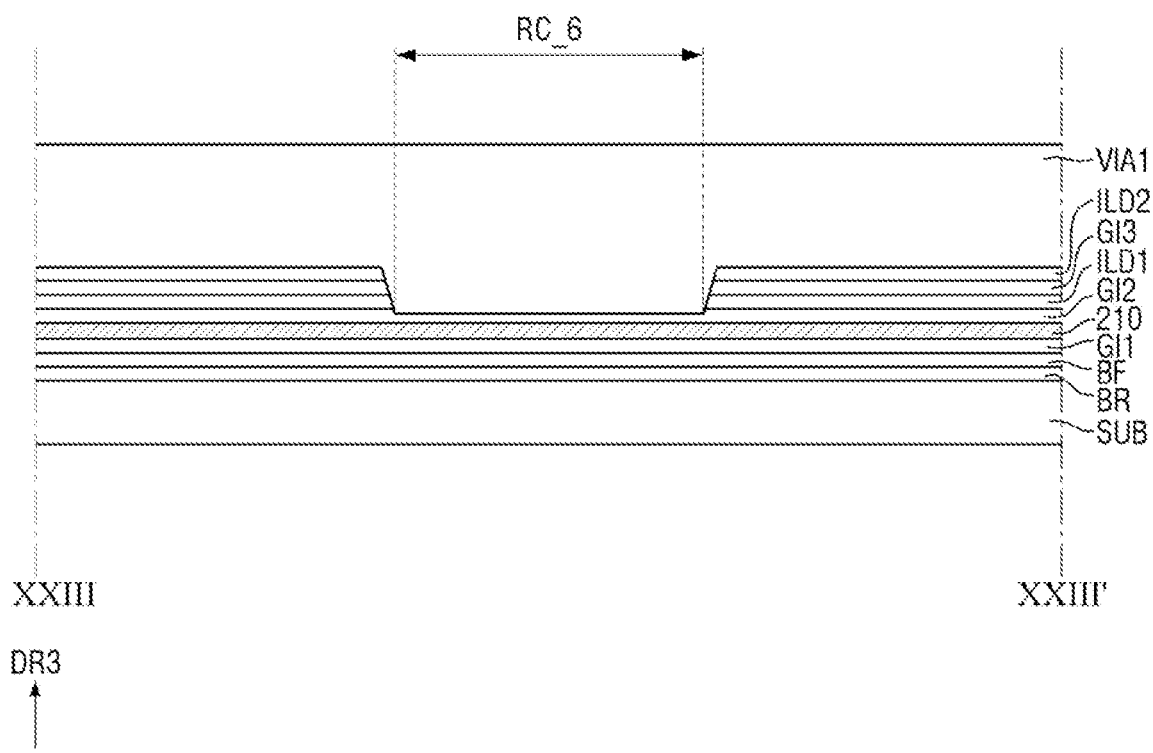
FIG. 23 is a cross-sectional view taken along line XXIII-XXIII' of FIG. 22.

FIG. 22 is a plan view of a first semiconductor layer and a first conductive layer according to yet another alternative embodiment. FIG. 23 is a cross-sectional view taken along line XXIII-XXIII' of FIG. 22.

Referring to FIGS. 22 and 23, in an embodiment, a first scan conductive pattern 210_6 and an emission control conductive pattern 220_6 of a display panel 10_6 may be extended in the first direction DR1, and the first scan conductive pattern 210_6 and the emission control conductive pattern 220_6 may be disposed across a plurality of pixels PX (see FIG. 4) arranged in the first direction DR1. The first scan conductive pattern 210_6 and the emission control conductive pattern 220_6 may cross the recess pattern RC_6 disposed between the pixels PX (see FIG. 4).

The recess pattern RC_6 may be defined by at least some of the insulating layers disposed on the first conductive layer 200. The recess pattern RC_6 may be defined by, but is not limited to, at least some of the inorganic insulating layers disposed on the first conductive layer 200.

The recess pattern RC_6 may be defined by at least some of a second interlayer dielectric film ILD2, a third gate insulating film GI3, a first interlayer dielectric film ILD1 and a second gate insulating film GI2. In an embodiment, for example, the recess pattern RC_6 may be defined by the second interlayer dielectric film ILD2, the third gate insulating film GI3, the first interlayer dielectric film ILD1 and the second gate insulating film GI2.

In such an embodiment, each of the second interlayer dielectric film ILD2, the third gate insulating film GI3 and the first interlayer dielectric film ILD1 defines a through hole passing therethrough in the thickness direction (the third direction DR3). The second gate insulating film GI2 may define a groove recessed from the surface (upper surface) toward the other surface (lower surface). In such an embodiment, the recess pattern RC may be defined by the through hole of each of the second interlayer dielectric film ILD2, the third gate insulating film GI3 and the first interlayer dielectric film ILD1, and by the groove of the second gate insulating film GI2. The through holes and the groove may overlap one another in the thickness direction (third direction DR3).

In such an embodiment, the first scan line GWL (see FIG. 3) may be formed of a first scan conductive pattern 210_6, and the emission control line EML (see FIG. 3) may be formed of an emission control conductive pattern 220_6. In such an embodiment, the first scan line GWL (see FIG. 3) may include the first scan conductive pattern 210_6 but may not include the first scan connection pattern 630 (see FIG. 5). In such an embodiment, the emission control line EML (see FIG. 3) may include the emission control conductive pattern 220_6 but may not include the emission control connection pattern 660 (see FIG. 5). In such an embodiment, the first scan line GWL (see FIG. 3) and the emission control line EML (see FIG. 3) may be formed of or defined by a single conductive layer, and the first scan line GWL (see FIG. 3) and the emission control line EML (see FIG. 3) may be formed of or defined by the first conductive layer 200.

In such an embodiment, although the second conductive layer 300 is described in detail, the disclosure is not limited thereto. The above-description on the first scan conductive pattern 210_6 and the emission control conductive pattern 220_6 may be equally applied to the first light-blocking pattern 320, the second light-blocking pattern 330, the second scan conductive pattern 510, and the third scan conductive pattern 520.

In such an embodiment, damage to each pixel PX by external impact may be substantially suppressed or effectively prevented, and the resolution may be improved since the first scan connection pattern 630 (see FIG. 5) and the emission control connection pattern 660 (see FIG. 5) may be omitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a first pixel;
   a second pixel disposed adjacent to the first pixel; and
   a recess pattern traversing between the first pixel and the second pixel when viewed from a top plan view,
   wherein each of the first pixel and the second pixel comprises:
     a first supply voltage line;
     a light-emitting element;
     a first transistor connected between the first supply voltage line and the light-emitting element;
     a second transistor connected between the first transistor and the light-emitting element; and
     a third transistor electrically connected to a first electrode of the light-emitting element, wherein the display device further comprises a first semiconductor layer which defines a channel of each of the first transistor, the second transistor, and the third transistor,
wherein the second transistor of the first pixel is electrically connected to the third transistor of the second pixel via the first semiconductor layer, and
wherein the first semiconductor layer overlaps the recess pattern between the first pixel and the second pixel.

2. The display device of claim 1,
wherein the first semiconductor layer comprises a first semiconductor connection pattern and a second semiconductor connection pattern connecting the second transistor of the first pixel with the third transistor of the second pixel, and
wherein the first semiconductor connection pattern and the second semiconductor connection pattern overlap the recess pattern.

3. The display device of claim 2,
wherein the first semiconductor connection pattern is extended in a first direction, and
wherein the second semiconductor connection pattern is extended in a second direction intersecting the first direction.

4. The display device of claim 3,
wherein the first semiconductor connection pattern intersects the recess pattern extended in the second direction, and
wherein the second semiconductor connection pattern intersects the recess pattern extended in the first direction.

5. The display device of claim 1, wherein at least one through hole is defined through the first semiconductor layer at a location where the first semiconductor layer overlaps the recess pattern.

6. The display device of claim 1, further comprising:
an etch stop pattern disposed on the first semiconductor layer at a location where the first semiconductor layer and the recess pattern overlap each other.

7. The display device of claim 6, wherein the recess pattern exposes the etch stop pattern.

8. The display device of claim 7, wherein the etch stop pattern has an island shape when viewed from the top plan view.

9. The display device of claim 6, further comprising:
a first conductive layer comprising gate electrodes of the first transistor, the second transistor and the third transistor of each of the first pixel and the second pixel,
wherein the etch stop pattern is defined by the first conductive layer.

10. The display device of claim 1,
wherein each of the first pixel and the second pixel further comprises a fourth transistor connected between the first electrode and the gate electrode of the first transistor, and
wherein the display device further comprises a second semiconductor layer which defines a channel of the fourth transistor and is different from the first semiconductor layer.

11. The display device of claim 10, further comprising:
a data line,
wherein each of the first pixel and the second pixel further comprises a fifth transistor connected to a second electrode of the first transistor and the data line, and
wherein a channel of the fifth transistor is defined by the second semiconductor layer.

12. The display device of claim 1, further comprising:
an emission control line,
wherein a gate electrode of the second transistor of each of the first pixel and the second pixel is electrically connected to the emission control line.

13. The display device of claim 12, further comprising:
an initialization voltage line,
wherein a first electrode of the third transistor is electrically connected to the initialization voltage line, and
wherein a second electrode of the third transistor is electrically connected to the light-emitting element.

14. A display device comprising:
a substrate;
pixels disposed on the substrate, wherein the pixels comprise a first pixel and a second pixel; and
a recess pattern at least partially disposed between the first pixel and the second pixel,
wherein each of the first pixel and the second pixel comprises:
a first semiconductor layer, and
insulating films disposed on the first semiconductor layer,
wherein the recess pattern is defined by at least one of the insulating films, and has a shape depressed from upper surfaces to lower surfaces of the insulating films, and
wherein the first semiconductor layer and the recess pattern intersect each other.

15. The display device of claim 14,
wherein the first semiconductor layer defines channels of a first transistor and a second transistor of each of the first pixel and the second pixel, and a semiconductor connection pattern connecting the channel of the first transistor of the first pixel with the channel of the second transistor of the second pixel, and
wherein the semiconductor connection pattern intersects the recess pattern.

16. The display device of claim 15, further comprising:
an emission control line, wherein a gate electrode of the first transistor of each of the first pixel and the second pixel is electrically connected to the emission control line.

17. The display device of claim 16, further comprising:
an initialization voltage line,
wherein a first electrode of the second transistor of each of the first pixel and the second pixel is electrically connected to the initialization voltage line.

18. The display device of claim 17,
wherein each of the first pixel and the second pixel further comprises a light-emitting element, and
wherein the light-emitting element is electrically connected to a second electrode of the second transistor.

19. The display device of claim 14, further comprising:
an etch stop pattern disposed on the first semiconductor layer at a location where the first semiconductor layer and the recess pattern overlap each other.

20. An electronic device for providing an image, the electronic device comprising:
a display device comprising:
a first pixel;
a second pixel disposed adjacent to the first pixel; and
a recess pattern traversing between the first pixel and the second pixel when viewed from a top plan view,
wherein each of the first pixel and the second pixel comprises:
a first supply voltage line;
a light-emitting element;

a first transistor connected between the first supply voltage line and the light-emitting element;
a second transistor connected between the first transistor and the light-emitting element; and
a third transistor electrically connected to a first electrode of the light-emitting element,
wherein the display device further comprises a first semiconductor layer which defines a channel of each of the first transistor, the second transistor, and the third transistor,
wherein the second transistor of the first pixel is electrically connected to the third transistor of the second pixel via the first semiconductor layer, and
wherein the first semiconductor layer overlaps the recess pattern between the first pixel and the second pixel.

* * * * *